(12) United States Patent
Song et al.

(10) Patent No.: US 10,079,357 B2
(45) Date of Patent: Sep. 18, 2018

(54) ORGANIC LIGHT EMITTING PIXEL AND ORGANIC LIGHT EMITTING DISPLAY DEVICE INCLUDING THE SAME

(71) Applicant: SAMSUNG DISPLAY CO., LTD., Yongin-si, Gyeonggi-do (KR)

(72) Inventors: Hajin Song, Hwaseong-si (KR); Heungsu Park, Anyang-si (KR); Bumsuk Lee, Hwaseong-si (KR); Sangwoo Lee, Hwaseong-si (KR); Sangwoo Pyo, Hwaseong-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 36 days.

(21) Appl. No.: 15/069,997

(22) Filed: Mar. 15, 2016

(65) Prior Publication Data
US 2017/0033306 A1 Feb. 2, 2017

(30) Foreign Application Priority Data
Jul. 29, 2015 (KR) ........................ 10-2015-0107358

(51) Int. Cl.
*H01L 51/50* (2006.01)
*H01L 51/52* (2006.01)
(Continued)

(52) U.S. Cl.
CPC ...... *H01L 51/5004* (2013.01); *H01L 27/3211* (2013.01); *H01L 27/3246* (2013.01);
(Continued)

(58) Field of Classification Search
None
See application file for complete search history.

(56) References Cited

U.S. PATENT DOCUMENTS

2008/0018239 A1* 1/2008 Matsuda ................ C09K 11/06
313/504
2009/0121239 A1* 5/2009 Asaki .................. H01L 51/5265
257/89
(Continued)

FOREIGN PATENT DOCUMENTS

EP          3 018 713 A1     5/2016
KR    10-2012-0130516 A    12/2012
(Continued)

OTHER PUBLICATIONS

European Search Report dated Dec. 7, 2016 in Corresponding European Patent Application No. 16168808.0.

*Primary Examiner* — Fernando L Toledo
*Assistant Examiner* — Valerie N Newton
(74) *Attorney, Agent, or Firm* — Lee & Morse, P.C.

(57) ABSTRACT

An organic light emitting pixel and an organic light emitting display device, the pixel including a first organic light emitting diode to emit light with a $n^{th}$ order resonance mode of a first wavelength, n being a natural number of at least 1; a second organic light emitting diode to emit light with the $n^{th}$ order resonance mode of a second wavelength, the second wavelength being shorter than the first wavelength; and a third organic light emitting diode to emit light with a $m^{th}$ order resonance mode of a third wavelength, the third wavelength being shorter than the first and second wavelengths, and m being a natural number that is larger than n.

33 Claims, 17 Drawing Sheets

(51) Int. Cl.
  *H01L 27/32*       (2006.01)
  *H01L 51/00*       (2006.01)
(52) U.S. Cl.
  CPC ...... *H01L 51/0052* (2013.01); *H01L 51/0073* (2013.01); *H01L 51/508* (2013.01); *H01L 51/5036* (2013.01); *H01L 51/5064* (2013.01); *H01L 51/5076* (2013.01); *H01L 51/5088* (2013.01); *H01L 51/5265* (2013.01); *H01L 2251/552* (2013.01)

(56) References Cited

U.S. PATENT DOCUMENTS

| | | |
|---|---|---|
| 2010/0044690 A1 | 2/2010 | Okutani et al. |
| 2010/0156280 A1* | 6/2010 | Song .................. H01L 51/5265 313/504 |
| 2013/0001528 A1 | 1/2013 | Chang et al. |
| 2015/0137082 A1 | 5/2015 | Kim et al. |

FOREIGN PATENT DOCUMENTS

| | | |
|---|---|---|
| KR | 10-2013-0007279 A | 1/2013 |
| KR | 10-2013-0007307 A | 1/2013 |
| KR | 10-2013-0007308 A | 1/2013 |
| KR | 10-2013-0007408 A | 1/2013 |
| KR | 10-2014-0013513 A | 2/2014 |
| WO | WO 2006/078005 A1 | 7/2006 |

\* cited by examiner

ORGANIC LIGHT EMITTING PIXEL AND ORGANIC LIGHT EMITTING DISPLAY DEVICE INCLUDING THE SAME

CROSS-REFERENCE TO RELATED APPLICATION

Korean Patent Application No. 10-2015-0107358, filed on Jul. 29, 2015, in the Korean Intellectual Property Office, and entitled: "Organic Light Emitting Pixel and Organic Light Emitting Display Device Including the Same," is incorporated by reference herein in its entirety.

BACKGROUND

1. Field

Embodiments relate to an organic light emitting pixel and an organic light emitting display device including the same.

2. Description of the Related Art

An organic light emitting diode is a self-emitting type device and has a wide viewing angle and excellent contrast. The organic light emitting diode also has a fast response time, high luminance, and a low driving voltage.

The organic light emitting diode may include an anode, and a hole transport layer, a light emitting layer, an electron transport layer, and a cathode which are sequentially laminated on the anode. For example, the hole transport layer, the light emitting layer, and the electron transport layer may be organic thin films that include organic compounds.

An operating principle of the organic light emitting diode may be as follows. When different voltages are applied to the anode and the cathode, respectively, the hole may be injected from the anode and may move through the hole transport layer to the light emitting layer, and the electron may be injected from the cathode and may move through the electron transport layer to the light emitting layer. The hole and electron may recombine in the light emitting layer to generate an exciton. Light is generated as the exciton moves from an excited state to a ground state.

SUMMARY

Embodiments are directed to an organic light emitting pixel and an organic light emitting display device including the same.

The embodiments may be realized by providing an organic light emitting pixel, including a first organic light emitting diode to emit light with a $n^{th}$ order resonance mode of a first wavelength, n being a natural number of at least 1; a second organic light emitting diode to emit light with the $n^{th}$ order resonance mode of a second wavelength, the second wavelength being shorter than the first wavelength; and a third organic light emitting diode to emit light with a $m^{th}$ order resonance mode of a third wavelength, the third wavelength being shorter than the first and second wavelengths, and m being a natural number that is larger than n.

The first organic light emitting diode may include a first anode, a first hole control layer on the first anode, a first resonance control layer on the first hole control layer, a first light emitting layer on the first resonance control layer, a first electron control layer on the first light emitting layer, and a first cathode on the first electron control layer; the second organic light emitting diode may include a second anode, a second hole control layer on the second anode, a second resonance control layer on the second hole control layer, a second light emitting layer on the second resonance control layer, a second electron control layer on the second light emitting layer, and a second cathode on the second electron control layer, the second cathode being a single body with the first cathode; and the third organic light emitting diode may include a third anode, a third hole control layer on the third anode, a third resonance control layer on the third hole control layer, a third light emitting layer on at least the third resonance control layer, a third electron control layer on the third light emitting layer, and a third cathode on the third electron control layer, the third cathode being a single body with the second cathode.

The first hole control layer, the second hole control layer, and the third hole control layer may be a single body, and the first hole control layer, the second hole control layer, and the third hole control layer being the single body may be a common hole control layer.

The common hole control layer may include a hole transport layer that transports holes to the first to third light emitting layers.

The hole transport layer may include a doped layer and an undoped layer that are divided in a thickness direction of the hole transport layer, the undoped layer being closer to the first to third light emitting layers than is the doped layer, the doped layer may include a p-type dopant and a hole transport material, and the undoped layer may include a hole transport material.

The common hole control layer may further include a hole injection layer that injects holes from the first to third anodes to the hole transport layer.

The organic light emitting pixel may further include an intermediate layer that is between the common hole control layer and the first to third anodes and that generates holes.

The intermediate layer may include hexaazatriphenylene hexacarbonitrile, molybdenum trioxide, or fullerene.

The first electron control layer, the second electron control layer, and the third electron control layer may be a single body, and the first electron control layer, the second electron control layer, and the third electron control layer being the single body may be a common electron control layer.

The third light emitting layer may include a first portion that overlaps with the first light emitting layer, a second portion that overlaps with the second light emitting layer, and a third portion that overlaps with the third resonance control layer.

The third light emitting layer may include an ambipolar compound.

The ambipolar compound may include anthracene, 9-phenylanthracene, 9,10-diphenylanthracene, or benzo(B)naphto (2,3-D)furan.

The first portion may be between the common hole control layer and the first light emitting layer, the second portion may be between the common hole control layer and the second light emitting layer, and the third portion may be between the third light emitting layer and the common electron control layer.

The first resonance control layer may have a LUMO level that is at least 0.2 eV higher than that of the first light emitting layer.

The first portion may be between the common electron control layer and the first light emitting layer, the second portion may be between the common electron control layer and second light emitting layer, and the third portion may be between the third light emitting layer and the common electron control layer.

The first wavelength may be about 620 to about 750 nm, the second wavelength may be about 495 to about 570 nm, and the third wavelength may be about 450 to about 495 nm.

n may be 1 and m may be 2.

The first organic light emitting diode may have a first resonance length (Lc1) according to the following Equation 1:

$$Lc1 = \frac{\lambda 1}{2Nc1} \times n \qquad \text{(Equation 1)}$$

the second organic light emitting diode may have a second resonance length (Lc2) according to the following Equation 2:

$$Lc2 = \frac{\lambda 2}{2Nc2} \times n, \qquad \text{(Equation 2)}$$

and the third organic light emitting diode may have a third resonance length (Lc3) according to the following Equation 3, $$Lc3 = \frac{\lambda 3}{2Nc3} \times m \qquad \text{(Equation 3)}$$

wherein, in Equations 1 to 3,

Nc1 is a first refractive index of a first resonance structure that provides the first resonance length of the first organic light emitting diode, $\lambda 1$ is the first wavelength, Nc2 is a second refractive index of a second resonance structure that provides the second resonance length of the second organic light emitting diode, $\lambda 2$ is the second wavelength, Nc3 is a third refractive index of a third resonance structure that provides the third resonance length of the third organic light emitting diode, and $\lambda 3$ is the third wavelength.

n may be 1 and m may be 2.

The embodiments may be realized by providing an organic light emitting display device having first to third light emitting regions and a non-light emitting region that is adjacent to the first to third light emitting regions, the device including a base layer; a first organic light emitting diode on the base layer in the first light emitting region to emit light with a first order resonance mode of a first wavelength; a second organic light emitting diode on the base layer in the second light emitting region to emit light with a first order resonance mode of a second wavelength, the second wavelength being shorter than the first wavelength; and a third organic light emitting diode on the base layer in the third light emitting region to emit light with a second order resonance mode of a third wavelength, the third wavelength being shorter than the first and second wavelengths.

The organic light emitting display device may further include a pixel defining film on the base layer, the pixel defining film including first to third openings respectively overlying the first to third light emitting regions.

The first organic light emitting diode may include a first anode in the first light emitting region, a first hole control layer on the first anode, a first resonance control layer on the first hole control layer, a first light emitting layer on the first resonance control layer, a first electron control layer on the first light emitting layer, and a first cathode on the first electron control layer, the second organic light emitting diode may include a second anode in the second light emitting region, a second hole control layer on the second anode, a second resonance control layer on the second hole control layer, a second light emitting layer on the second resonance control layer, a second electron control layer on the second light emitting layer, and a second cathode on the second electron control layer, the third organic light emitting diode may include a third anode in the third light emitting region, a third hole control layer on the third anode, a third resonance control layer on the third hole control layer, a third light emitting layer on the third resonance control layer and overlapping the first to third light emitting regions and the non-light emitting region, a third electron control layer on the third light emitting layer, and a third cathode on the third electron control layer, the first to third control layers may be portions of a common hole control layer that is a single body, the first to third electron control layers may be portions of a common electron control layer that is a single body, and the first to third cathodes may be portions of a common cathode that is a single body.

The common hole control layer may include a hole transport layer that transports holes to the first to third light emitting layers.

The hole transport layer may include a doped layer and an undoped layer that are divided in a thickness direction of the hole transport layer, the undoped layer being closer to the first to third light emitting layers than is the doped layer, the doped layer may include a p-type dopant and a hole transport material, and the undoped layer may include a hole transport material.

The common hole control layer may further include a hole injection layer that injects holes from the first to third anodes to the hole transport layer.

The organic light emitting display device may further include an intermediate layer that is between the common hole control layer and the first to third anodes and that generates holes.

The intermediate layer may include hexaazatriphenylene hexacarbonitrile, molybdenum trioxide, or fullerene.

The third light emitting layer may include an ambipolar compound.

The ambipolar compound may include anthracene, 9-phenylanthracene, 9,10-diphenylanthracene, or benzo(B)naphto (2,3-D)furan.

The third light emitting layer may include a first portion between the common hole control layer and the first light emitting layer, a second portion between the common hole control layer and the second light emitting layer, and a third portion between the third light emitting layer and the common electron control layer.

The first resonance control layer may have a LUMO level that is at least 0.2 eV higher than that of the first light emitting layer.

The third light emitting layer may include a first portion between the common electron control layer and the first light emitting layer, a second portion between the common electron control layer and the second light emitting layer, and a third portion between the third light emitting layer and the common electron control layer.

Light of the first wavelength may be a red light, light of the second wavelength may be a green light, and light of the third wavelength may be a blue light.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
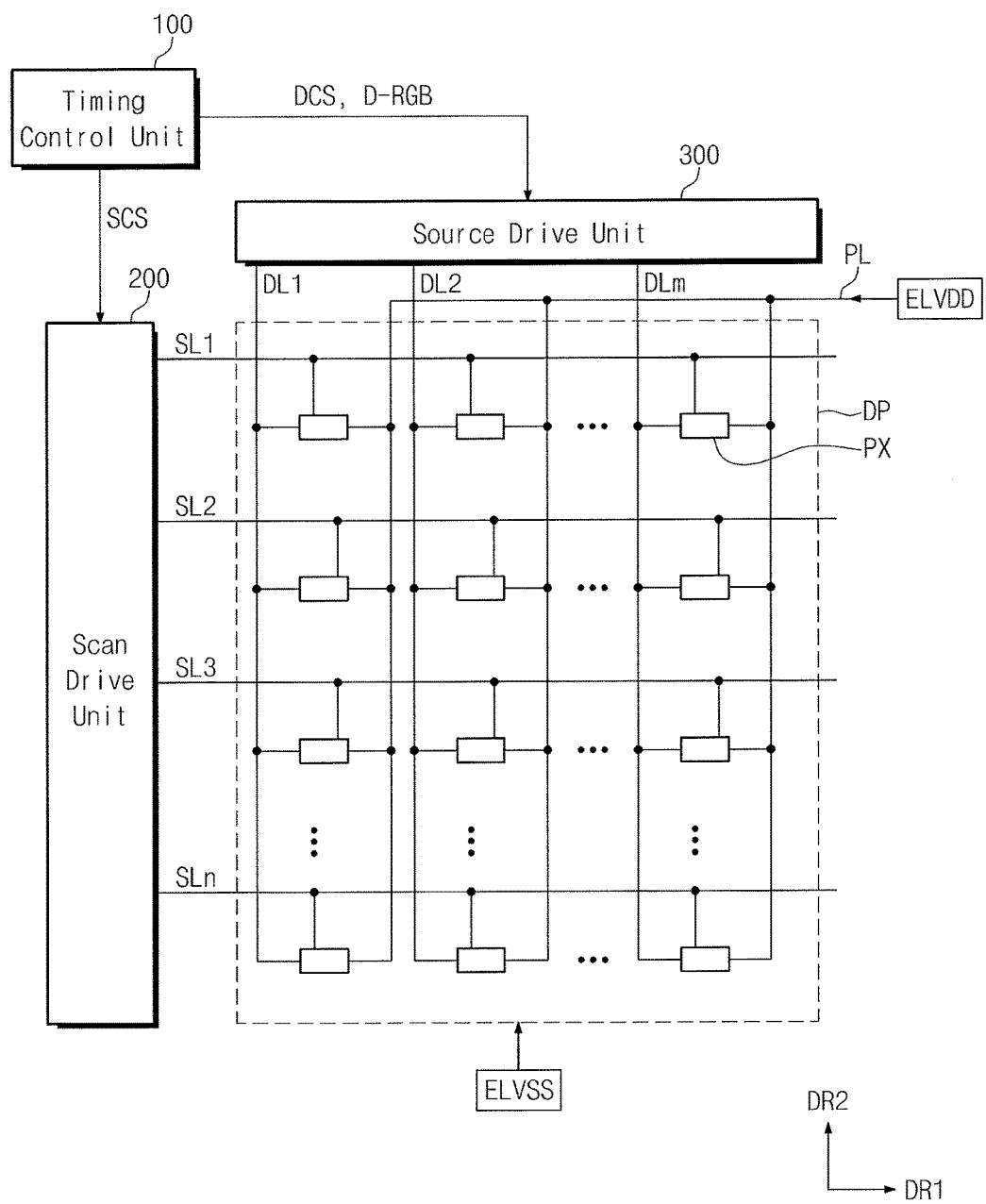
FIG. 1 illustrates a block diagram of an organic light emitting display device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when an element is referred to as being "on" another element, it can be directly on the other element, or intervening elements may also be present. Further, it will be understood that when an element is referred to as being "under" another element, it can be directly under, and one or more intervening elements may also be present. In addition, it will also be understood that when an element is referred to as being "between" two elements, it can be the only element between the two elements, or one or more intervening elements may also be present. Like reference numerals refer to like elements throughout.

Figure 2:
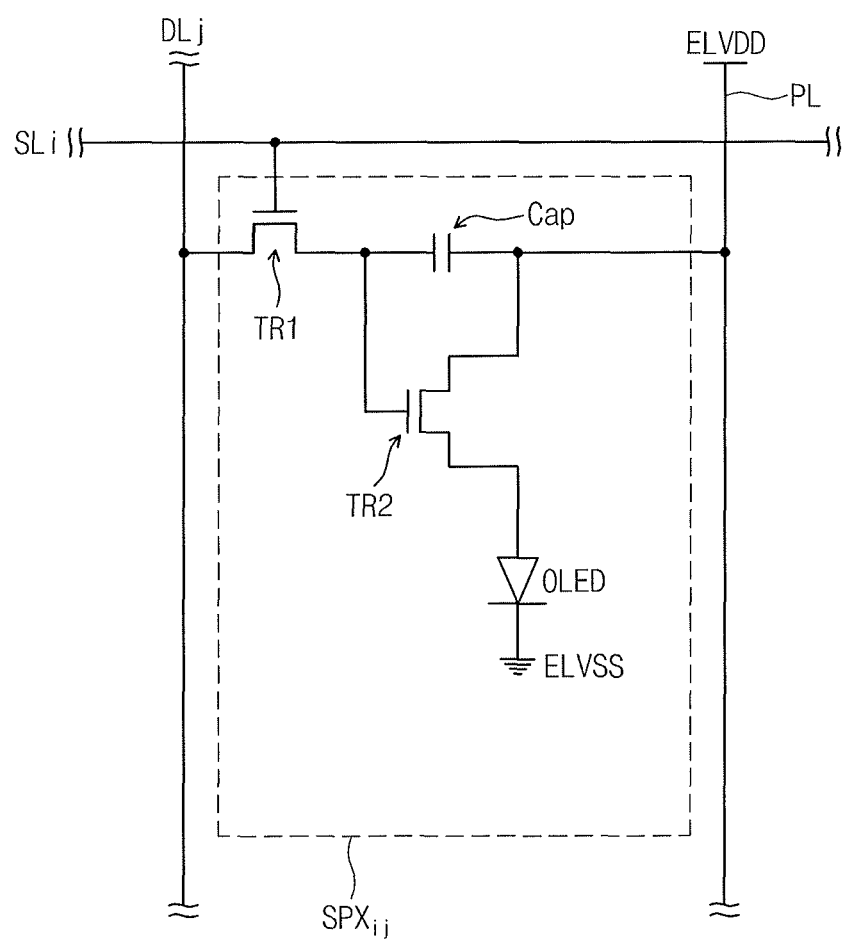
FIG. 2 illustrates a circuit diagram of a subpixel according to an embodiment.

FIG. 1 illustrates a block diagram of an organic light emitting display device according to an embodiment. FIG. 2 illustrates a circuit diagram of a subpixel according to an embodiment. Hereinafter, the organic light emitting display device according to the present embodiment will be described with reference to FIGS. 1 and 2.

As illustrated in FIG. 1, the organic light emitting display device may include a timing control unit 100, a scan drive unit 200, a source drive unit 300, and an organic light emitting display panel DP.

The timing control unit 100 may receive input image signals and may convert a data format of the input image signals in accordance with an interfacing specification with the source drive unit 300 to generate image data D-RGB. The timing control unit 100 may output the image data D-RGB and various control signals (DCS, SCS).

The scan drive unit 200 may receive a scan control signal SCS from the timing control unit 100. The scan control signal SCS may include a vertical initiation signal that initiates an operation of the scan control unit 200, a clock signal that determines an output time of signals, etc. The scan drive unit 200 may generate gate signals in response to the scan control signal SCS, and may sequentially output the gate signals to scan lines SL1 to SLn which are described below.

FIG. 1 illustrates the gate signals as being output from one of the scan drive line 200. In an embodiment, the organic light emitting display device may include a plurality of scan drive lines. The scan drive lines may output the gate signals that differ from each other.

The source drive unit 300 may receive the data control signal DCS and the image data D-RGB from the timing control unit 100. The source driving unit 300 may convert the image data D-RGB to data signals, and may output the data signals to the source lines DL1 to DLm which are described below. The data signals may be analog voltages that respectively correspond to gradation values of the image data D-RGB.

The organic light emitting display panel DP may include the scan lines SL1 to SLn, the source lines DL1 to DLm, and the subpixels SPX. The scan lines SL1 to SLn may extend in a first directional axis DR1, and may be arranged along a second directional axis DR2 that intersects with the first directional axis DR1. The source lines DL1 to DLm may intersect with the scan lines SL1 to SLn such that insulation is maintained therebetween. The organic light emitting display panel DP according to an embodiment may further include signal lines that provide signals differing from the gate and data signals to the subpixels SPX, depending on the circuit structure of the subpixels SPX.

Each of the subpixels SPX may be connected to a corresponding scan line among the scan lines SL1 to SLn and a corresponding source line among the source lines DL1 to DLm. Each of the subpixels SPX may receive a first voltage ELVDD and a second voltage ELVSS of which a level is lower than that of the first voltage ELVDD. Each of the subpixels SPX may be connected to a power line PL to which the first voltage ELVDD is applied.

In FIG. 2, an equivalent circuit of a subpixel SPXij which is connected to an ith scan line SLi and a jth source line DLj is exemplarily illustrated. Although not specifically illustrated, other subpixels which are illustrated in FIG. 1 may also have the same equivalent circuit.

As illustrated in FIG. 2, the subpixel SPXij includes at least one transistor, at least one capacitor, and the organic light emitting diode. A pixel circuit having two transistors and one capacitor is exemplarily illustrated in the present embodiment, but the configuration of the subpixel SPXij is not limited thereto.

The subpixel SPXij includes a first transistor TR1, a second transistor TR2, a capacitor Cap, and an organic light emitting diode OLED. The first transistor TR1 outputs the data signal applied to the jth source line DLj, in response to the data signal which is applied to the ith scan line SLi. The capacitor Cap is charged to the voltage which corresponds to the data signal received from the first transistor TR1. The second transistor TR2 controls a drive current which flows in the organic light emitting diode OLED in response to the voltage stored in the capacitor Cap.

Figure 3:
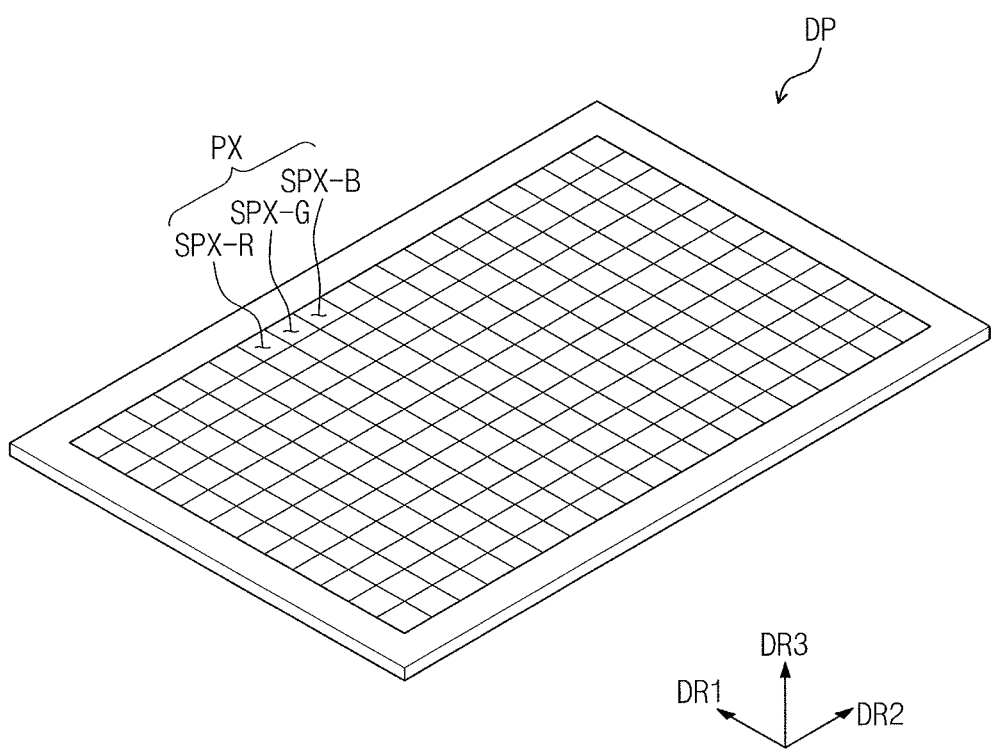
FIG. 3 illustrates a perspective view of an organic light emitting display panel according to an embodiment.

FIG. 3 illustrates a perspective view of the organic light emitting display panel DP according to an embodiment. FIGS. 4A to 4D are plan views of the organic light emitting display panel DP according to an embodiment of the inventive concept.

As illustrated in FIG. 3, the organic light emitting display panel DP includes a plurality of subpixels SPX-R, SPX-G, and SPX-B. Three types of the subpixels SPX-R, SPX-G, and SPX-B are illustrated as examples, and the three types of the subpixels SPX-R, SPX-G, and SPX-B may generate light of colors which differ from each other. For example, the three types of the subpixels SPX-R, SPX-G, and SPX-B may respectively emit red light, green light, and blue light. The three types of the subpixels SPX-R, SPX-G, and SPX-B according to an embodiment of the inventive concept may also respectively emit magenta light, yellow light, and cyan light. The three types of the subpixels SPX-R, SPX-G, and SPX-B may emit light along a third directional axis DR3 in FIG. 3.

A combination of the subpixels SPX-R, SPX-G, and SPX-B which generate lights of colors which differ from each other is defined as a pixel PX. As illustrated in FIG. 3, the pixel PX may include the three types of the subpixels SPX-R, SPX-G, and SPX-B. The pixel PX according to an embodiment of the inventive concept may also include four types of the subpixels, and four types of the subpixels may also respectively emit red light, green light, blue light, and white light.

Figure 4A:
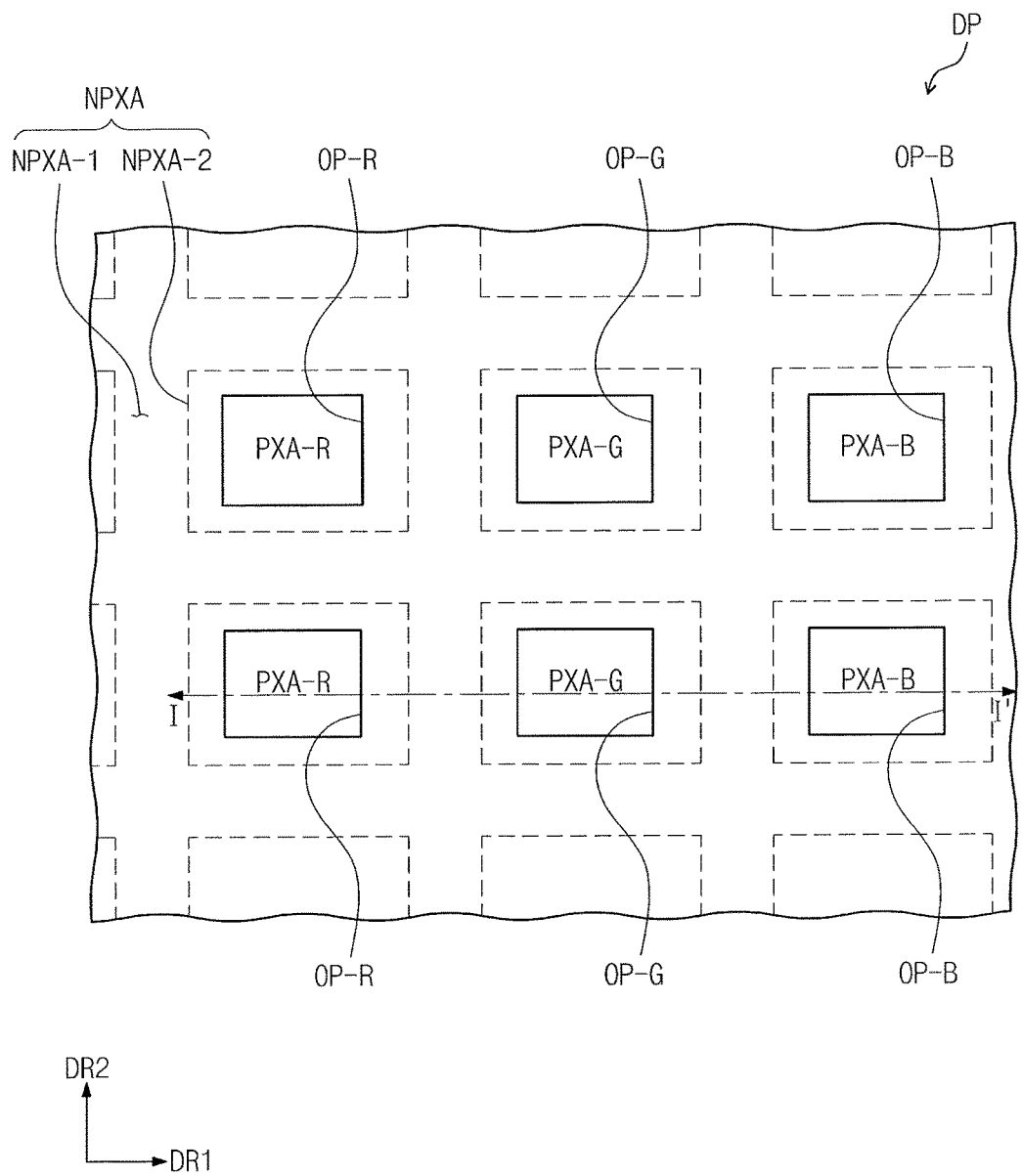
FIGS. 4A to 4D illustrate plan views of organic light emitting display panels according to an embodiment.

As illustrated in FIG. 4A, the organic light emitting display panel DP is divided into a plurality of light emitting regions PXA-R, PXA-G, and PXA-B and a non-light emitting region NPXA on a plane which is defined by the first directional axis DR1 and the second directional axis DR2. FIG. 4A illustrates as an example three types of the light emitting regions PXA-R, PXA-G, and PXA-B which are arranged in a form of a matrix. The organic light emitting diodes of three types of the subpixels SPX-R, SPX-G, and SPX-B (refer to FIG. 3) are respectively arranged in the three types of the light emitting regions PXA-R, PXA-G, and PXA-B.

The non-light emitting region NPXA may be divided into first non-light emitting regions NPXA-1 which surround the three types of the light emitting regions PXA-R, PXA-G, and PXA-B and a second non-light emitting region NPX-2 which is disposed between the first non-light emitting regions NPX-1. The signal lines, for example, the scan line SLi (refer to FIG. 2), the source line DLj (refer to FIG. 2), or the power line PL (refer to FIG. 2), are disposed in the first non-light emitting region NPXA-1. Corresponding circuitry of the subpixels, for example, the transistors TR1 and TR2 (refer to FIG. 2) or capacitors Cap (refer to FIG. 2), are disposed in each of the second non-light emitting regions NPX-2.

Figure 4B:
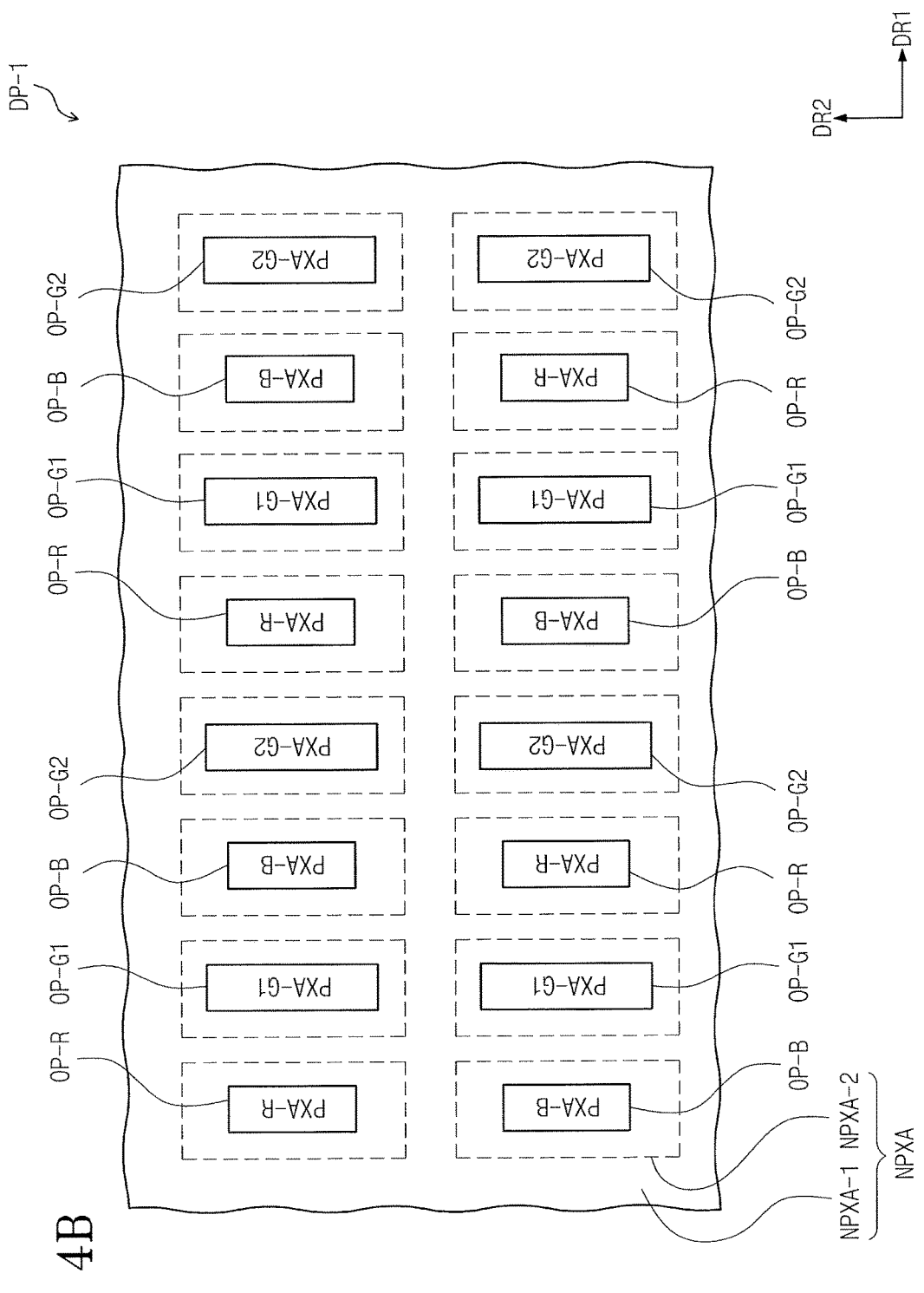
Figure 4C:
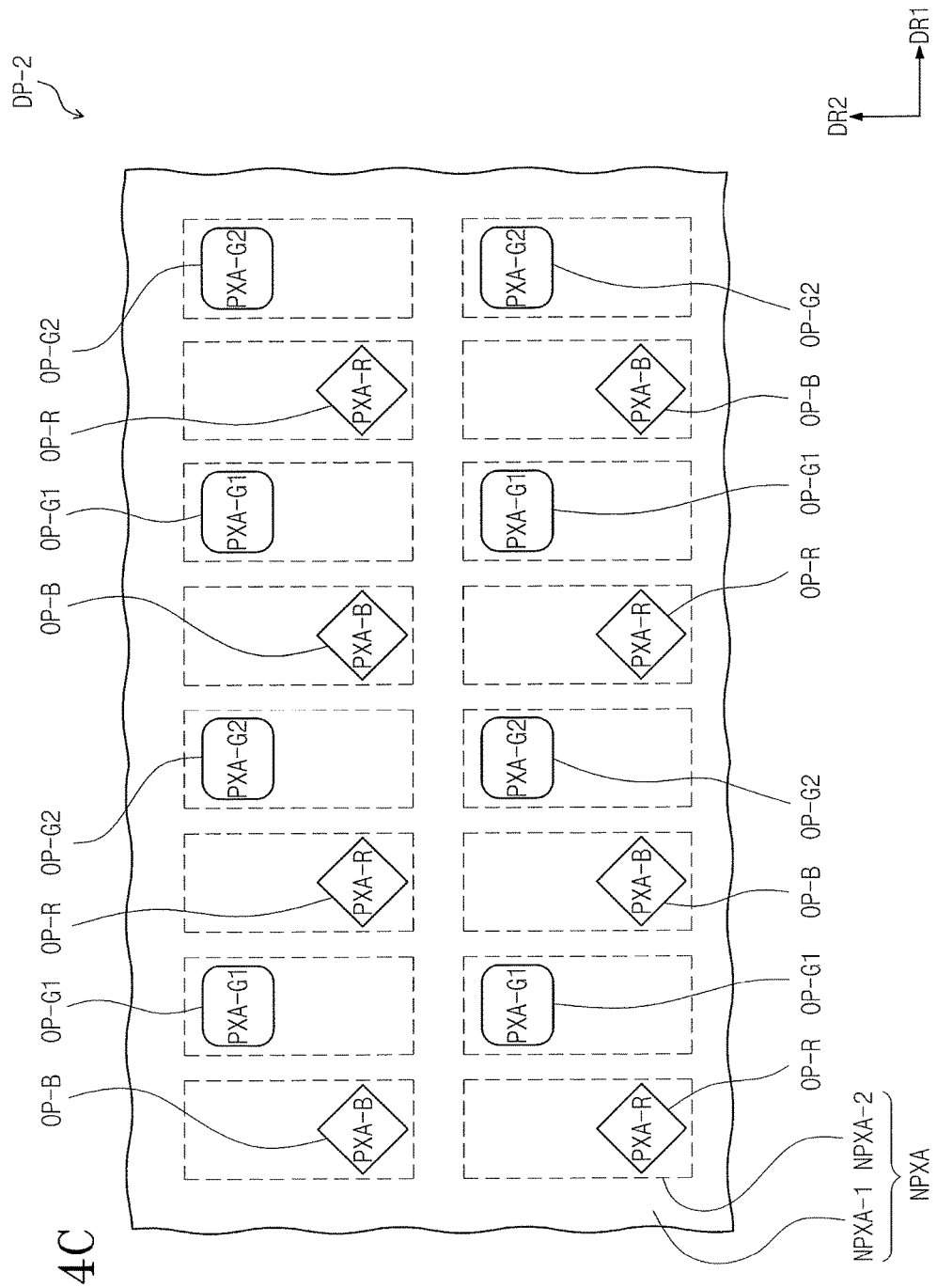
Figure 4D:
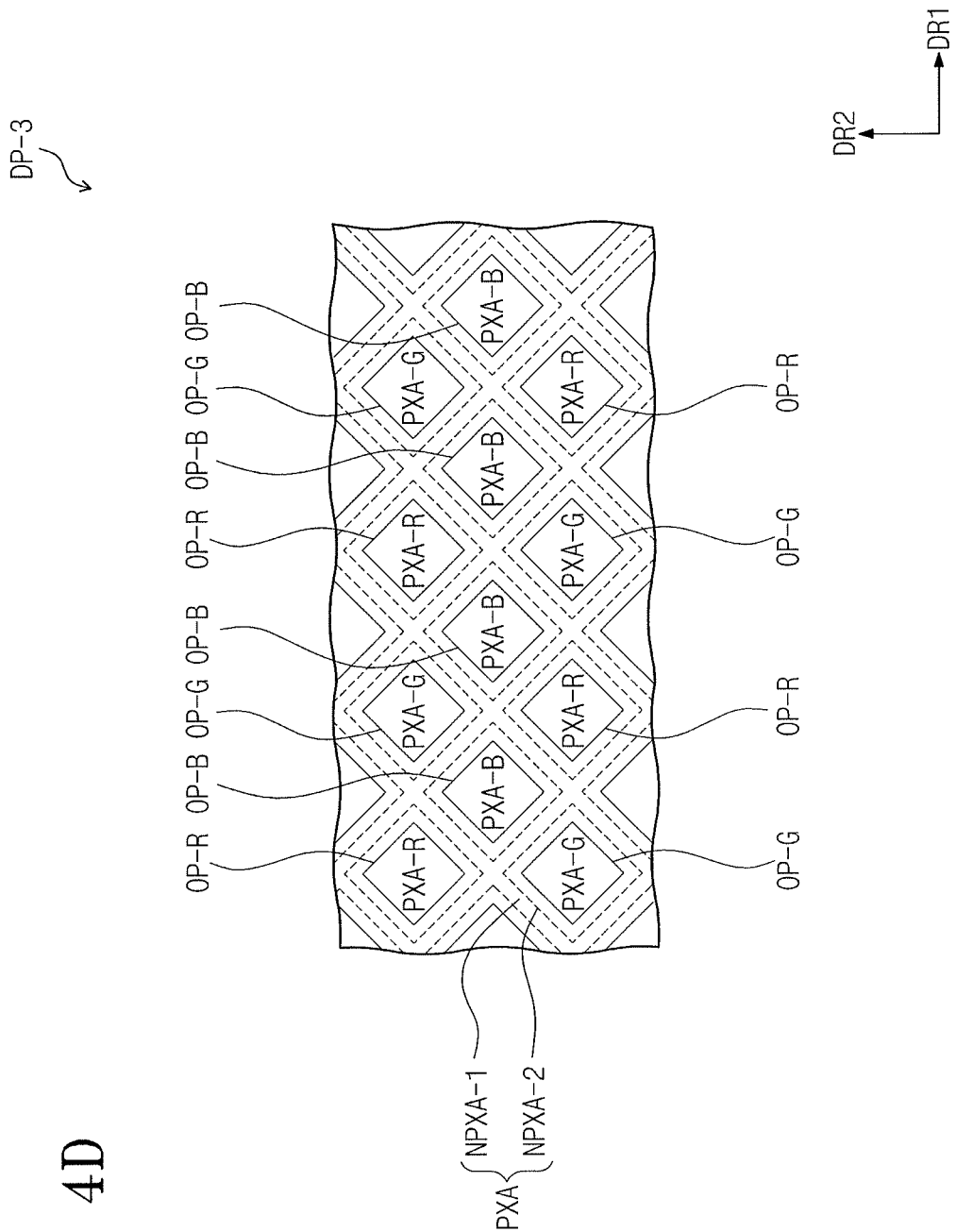

FIGS. 4B to 4D illustrate as examples plan views of the organic light emitting display panels DP1, DP2, and DP3 which have a subpixel arrangement which differs from a striped pixel arrangement which is illustrated in FIG. 4A. As illustrated in FIGS. 4B and 4C, four of the light emitting regions PXA-R, PXA-G1, PXA-B, and RGB-G2 may be arranged in a repeating fashion. The organic light emitting diodes of the corresponding subpixels are disposed in the four light emitting regions PXA-R, PXA-G1, PXA-B, and RGB-G2, respectively. Positions of the blue light emitting region PXA-B and the red light emitting region PXA-R may be substituted for each other according to pixel row. As illustrated in FIG. 4D, the blue light emitting region PXA-B may be surrounded by two of the red light emitting regions PXA-R and two of the green light emitting regions PXA-G. Here, two of the red light emitting regions PXA-R may be positioned along a diagonal line, and two of the green light emitting regions PXA-G may be positioned along a diagonal line. As such, an embodiment of the inventive concept is not limited to a typical striped subpixel arrangement.

Figure 5:
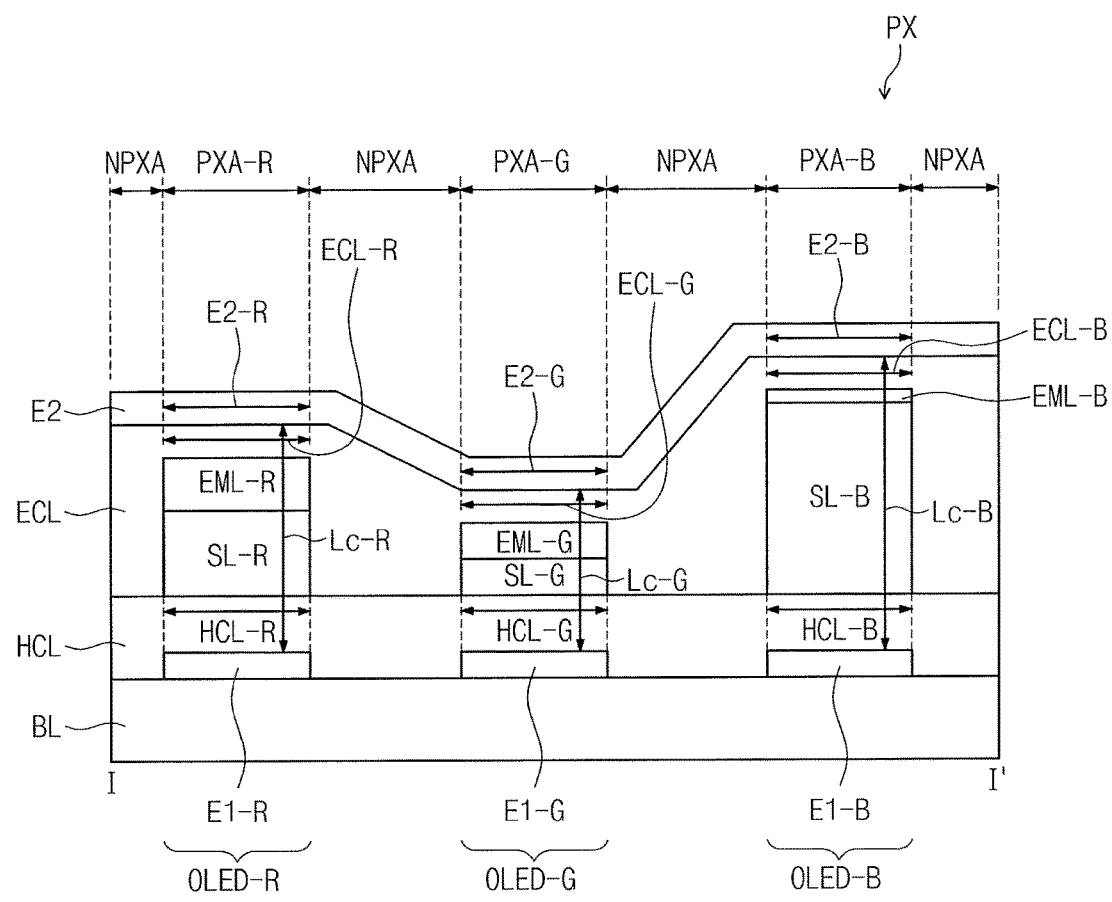
FIG. 5 illustrates a sectional view of a pixel according to an embodiment.

FIG. 5 illustrates a sectional view of the pixel PX according to an embodiment. A cross-section taken along line I-I' in FIG. 4A is illustrated.

The pixel PX may include first, second, and third light emitting diodes OLED-R, OLED-G, and OLED-B. The first, second, and third light emitting diodes OLED-R, OLED-G, and OLED-B may be respectively disposed in the first, second, and third light emitting regions PXA-R, PXA-G, and PXA-B.

The first light emitting diode OLED-R may emit light with a $n^{th}$ order resonance mode of a first wavelength (where n is a natural number of at least 1). The second light emitting diode OLED-G may emit light with the $n^{th}$ order resonance mode of a second wavelength. The second wavelength may be shorter than the first wavelength. The third light emitting diode OLED-B may emit light with an $m^{th}$ order resonance mode of a third wavelength (where m is a natural number which is larger than n), and the third wavelength may be shorter than the first wavelength and the second wavelength. In an implementation, n may be 1 and m may be 2.

Each of the first to third organic light emitting diodes OLED-R, OLED-G, and OLED-B may include an anode E1-R, E1-G, and E1-B, a hole control layer HCL, a resonance control layer SL-R, SL-G, and SL-B, a light emitting layer EML-R, EML-G, and EML-B, an electron control layer ECL, and a cathode E2. A distance between a front surface (e.g., a top surface along the third directional axis DR3) of the anode E1-R, E1-G, and E1-B and an undersurface (e.g., a bottom surface along the third directional axis DR3) of the cathode E2 in each of the first to third organic light emitting diodes OLED-R, OLED-G, and OLED-B may be defined as a resonance length Lc according to the following Equation A.

$$Lc = \frac{\lambda}{2Nc} \times k \quad \text{(Equation A)}$$

In Equation A, Nc is defined as the effective refractive index of a resonance structure, λ as the wavelength of light which is to be resonated, and k as the order of resonance. For example, the k is the order of a resonance mode. The resonance structure may include all functional layers between the anodes E1-R, E1-G, and E1-B and the cathode E2. In an implementation, the functional layers may include at least one of the resonance control layers SL-R, SL-G, and SL-B, the light emitting layers EML-R, EML-G, and EML-B, or the electron control layer ECL. Thus, and the functional layers may further include additional functional layers. The effective refractive index of the resonance structure that includes the plurality of functional layers may be derived by calculating the refractive indices of the plurality of functional layers. For example, the effective refractive index of the resonance structure that includes two functional layers may be derived according to Equation B below.

$$Nc = \frac{2 \times N1 \times N2}{N1 + N2} \quad \text{(Equation B)}$$

In Equation B, N1 is the refractive index of any one of the functional layers, and N2 is the refractive index of the other one of the functional layers. The effective refractive index of the resonant structure that includes three or more functional layers may be derived through other suitable methods.

In FIG. 5, a first resonance length Lc-R represents the resonance length of the first organic light emitting diode OLED-R according to Equation A, a second resonance length Lc-G represents the resonance length of the second organic light emitting diode OLED-G according to Equation A, and a third resonance length represents the resonance length of the third organic light emitting diode OLED-B according to Equation A.

In an implementation, the wavelength of the first light emitted from the first organic light emitting diode OLED-R may be, e.g., about 620 to about 750 nm, the wavelength of the second light emitted from the second organic light emitting diode OLED-G may be, e.g., about 495 to about 570 nm, and/or the wavelength of the third light emitted from the third organic light emitting diode OLED-B may be, e.g., about 450 to about 495 nm. In an implementation, the first organic light emitting diode OLED-R may emit, e.g., red light, the second organic light emitting diode OLED-G may emit, e.g., green light, and the third organic light emitting diode OLED-B may emit, e.g., blue light.

In an implementation, each of the first and second organic light emitting diodes OLED-R and OLED-G may have a first order resonance structure and the third organic light emitting diode OLED-B may have a second order resonance structure, and the third resonance length Lc-B may be larger than the first resonance length Lc-R and/or the second resonance length Lc-G. The wavelength of the first light may be longer than the wavelength of the second light, and the first resonance length Lc-R may be larger than the second resonance length Lc-G.

Each of the first and second organic light emitting diodes OLED-R and OLED-G may have the first order resonance structure and the third organic light emitting diode OLED-B has the second order resonance structure, thereby reducing manufacturing costs. For example, each of the first and second organic light emitting diodes OLED-R and OLED-G may have the first resonance structure, so that the thicknesses of the resonance control layers SL-R and SL-G and light emitting layers EML-R and EML-G in the first and second organic light emitting diodes may become thinner. Consequently, the amount of materials used in the resonance control layers SL-R and SL-G and light emitting layers EML-R and EML-G may be advantageously reduced.

As shown in the following Table 1, the driving efficiencies of the first and second organic light emitting diodes OLED-R and OLED-G may be improved. The driving voltage and current efficiency were measured with respect to the same luminance.

TABLE 1

| Top Emission Configuration | Driving Voltage (V) | Current Efficiency (cd/A) | Luminance (cd/m$^2$) | Resonance Length (Å) |
|---|---|---|---|---|
| First Organic Light Emitting Diode With Second Resonance (OLED-R) | 5.0 | 45.1 | 3700 | 2740 |
| First Organic Light Emitting Diode With First Resonance (OLED-R) | 4.2 | 50.6 | 3700 | 1100 |
| Second Organic Light Emitting Diode With Second Resonance (OLED-G) | 4.1 | 107.5 | 9000 | 2240 |
| Second Organic Light Emitting Diode With First Resonance (OLED-G) | 3.7 | 104.3 | 9000 | 900 |

As seen in Table 1, the first organic light emitting diode OLED-R with first order resonance mode has a lower driving voltage and a higher current efficiency than the first organic light emitting diode OLED-R with second resonance. The second organic light emitting diode OLED-G with first order resonance mode has a lower driving voltage and maintains the current efficiency equivalent to that of the second organic light emitting diode OLED-G with second resonance.

Through the third organic light emitting diode OLED-B having a second resonance, failures of the third organic light emitting diodes OLED-B may be reduced. If the third organic light emitting diode OLED-B were to have a first order resonance structure, a distance between the anode E1-B and the light emitting layer EML-B would be short, and thus impurities could cause dark spots to be generated. The resonance control layer SL-B may maintain spacing of at least a certain distance between the anode E1-B and the light emitting layer EML-B, and dark spot defects may be reduced in the third organic light emitting diode OLED-B.

A lamination structure of the first to third organic light emitting diodes OLED-R, OLED-G, and OLED-B included in the pixel PX will be described in more detail with reference to FIG. 5. The lamination structure described below is merely an example.

The first to third organic light emitting diodes OLED-R, OLED-G, and OLED-B may be disposed on a base layer BL. The base layer BL may include, e.g., an organic layer, an inorganic layer, a glass substrate, a metal substrate, etc.

The first to third anodes E1-R, E1-G, and E1-B in the first to third organic light emitting diodes OLED-R, OLED-G, and OLED-B may be disposed on the base layer BL. Each of the first to third anodes E1-R, E1-G, and E1-B may be, e.g., a transmissive electrode, a transflective electrode, or a reflective electrode depending on the emission direction of the organic light emitting diode. For example, the bottom emission type organic light emitting diode may include the transmissive anode, and the top emission type organic light emitting diode may include the reflective or transflective anode.

Each of the transmissive first to third anodes E1-R, E1-G, and E1-B may include, e.g., indium tin oxide (ITO), indium zinc oxide (IZO), zinc oxide (ZnO), indium tin zinc oxide (ITZO), etc. The transflective or reflective first to third anodes E1-R, E1-G, and E1-B may include, e.g., silver (Ag), magnesium (Mg), aluminum (Al), platinum (Pt), palladium (Pd), gold (Au), nickel (Ni), neodymium (Nd), iridium (Ir), chromium (Cr), or mixtures of such metals.

The first to third anodes E1-R, E1-G, and E1-B may be, e.g., single-layered structures made of a transparent metal oxide or a metal, or multi-layered structures having multiple layers. For example, each of the first to third anodes E1-R, E1-G, and E1-B may have a single-layered structure of ITO, Ag, or a metal mixture (for example, a metal mixture of silver and magnesium), a double-layered structure of ITO/Mg or ITO/magnesium fluoride (MgF), or a triple-layered structure of ITO/Ag/MgF. The first to third anodes E1-R, E1-G, and E1-B may be formed through a deposition process by using a fine metal mask (FMM) that has a plurality of openings.

The hole control layer HCL (which covers the first to third anodes E1-R, E1-G, and E1B) may be disposed on the base layer BL. In an implementation, the hole control layer HCL may have or provide a flat surface as shown in FIG. 5. In an implementation, multiple stepped portions may also be provided that correspond to the anodes E1-R, E1-G, and E1-B.

The hole control layer HCL may include first to third portions HCL-R, HCL-G, and HCL-B that correspond to the first to third light emitting regions PXA-R, PXA-G, and PXA-B. The hole control layer HCL may be provided in the first to third light emitting regions PXA-R, PXA-G, and PXA-B as well as in the non-light emitting region NPXA. The hole control layer HCL may be formed through a deposition process by using an open mask. The hole control layers HCL of the first to third organic light emitting diodes OLED-R, OLED-G, and OLED-B may be formed as a single body (e.g., may be monolithically formed as a one-piece structure). The single-bodied hole control layers HCL of the first to third light emitting diodes OLED-R, OLED-G, and OLED-B may be defined as a common hole control layer.

The hole control layer HCL may have a single-layered structure made of a single material, a single layered structure that includes a plurality of different materials (e.g., a mixture layer), or a multi-layered structure having multiple layers that are made of a plurality of different materials. The hole control layer HCL may include at least one of a hole injection layer, a hole transport layer, a buffer layer, or an electron blocking layer. Such functional layers in the hole control layer HCL may be formed using various methods, e.g., vacuum deposition, spin coating, casting, Langmuir-Blodgett, inkjet printing, laser printing, laser induced thermal imaging (LITI), etc.

The first to third resonance control layers SL-R, SL-G, and SL-B may be disposed on the hole control layer HCL. The first to third resonance control layers SL-R, SL-G, and SL-B may include, e.g., a hole transport material. The first to third hole control layers SL-R, SL-G, and SL-B may be provided to realize the first to third resonance lengths Lc-R, Lc-G, and Lc-B.

The first to third light emitting layers EML-R, EML-G, and EML-B may be disposed on the first to third resonance control layers SL-R, SL-G, and SL-B. Each of the first to third light emitting layers EML-R, EML-G, and EML-B may have, e.g., a single-layered structure made of a single material, a single-layered structure that includes a plurality of different materials, or a multi-layered structure having multiple layers that are made of a plurality of different materials. The first to third light emitting layers EML-R, EML-G, and EML-B may be formed by using various methods, e.g., vacuum deposition, spin coating, casting, Langmuir-Blodgett, inkjet printing, laser printing, laser induced thermal imaging (LITI), etc.

A suitable material may be used for the first to third light emitting layers EML-R, EML-G, and EML-B, e.g., the first to third light emitting layer EML-R, EML-G, and EML-B may be made of materials that emit red, green, or blue light, or that include fluorescent or phosphorescent materials. In an implementation, the first and second light emitting layers EML-R and EML-G may include a phosphorescent material and the third light emitting layer EML-B may include a fluorescent material.

In an implementation, each of the first to third light emitting layers EML-R, EML-G, and EML-B may include a host and dopant. Examples of the host may include tris(8-hydroxyquinolino)aluminum (Alq3), 4,4'-bis(N-carbazolyl)-1,1'-biphenyl (CBP), poly(n-vinylcarbazole) (PVK), 9,10-di(naphthalene-2-yl)anthracene (ADN), 4,4',4"-Tris(carbazol-9-yl)-triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), and 2-methyl-9,10-bis(naphthalen-2-yl)anthracene (MADN).

The first light emitting layer EML-R may include, e.g., a fluorescent material that includes (dibenzoylmethanato)phenanthoroline europium (PBD:Eu(DBM)$_3$(Phen)) or perylene. In an implementation, the first light emitting layer EML-R may include, e.g., a metal complex dopant such as (bis(1-phenylisoquinoline)acetylacetonate iridium (PIQIr(acac)), tris(1-phenylquinoline)iridium (PQIr), or octaethylporphyrin platinum (PtOEP), or an organometallic complex dopant. In an implementation, the first light emitting layer EML-R may include a phosphorescent material such as Btp$_2$Ir(acac), etc. In an implementation, the first light emitting layer EML-R may include other light emitting materials.

In an implementation, the second light emitting layer EML-G may include a fluorescent material that includes tris(8-hydroxyquinolino)aluminum (Alq3). In an implementation, the second light emitting layer EML-G may include, e.g., a metal complex dopant such as fac-tris(2-phenylpyridine)iridium (Ir(ppy)$_3$), or an organometallic complex dopant. In an implementation, the second light emitting layer EML-G may include, e.g., a phosphorescent material such as Ir(ppy)$_3$, etc. In an implementation, the second light emitting layer EML-G may include other light emitting materials.

In an implementation, the third light emitting layer EML-B may include a fluorescent material, e.g., spiro-DPVBi, spiro-6P, distyryl-benzene (DSB), distyryl-arylene (DSA), polyfluorene (PFO)-based polymer, and/or poly(p-phenylene vinylene) (PPV)-based polymer. In an implementation, the third light emitting layer EML-B may include, e.g., a metal complex dopant such as (4,6-F$_2$ppy)$_2$Irpic, or an organometallic complex dopant. In an implementation, the third light emitting layer EML-B may include other light emitting materials.

The electron control layer ECL (which covers the first to third light emitting layers EML-R, EML-G, and EML-B) may be disposed on the hole control layer HCL. The electron control layer ECL may include first to third portions ECL-R, ECL-G, and ECL-B (hereinafter, referred to as first to third electron control layers) that correspond to the first to third light emitting regions PXA-R, PXA-G, and PXA-B. The electron control layer ECL may be formed in the first to third light emitting regions PXA-R, PXA-G, and PXA-B as well as in the non-light emitting region NPXA. In an implementation, the electron control layer ECL may be formed through a deposition process by using the open mask. The electron control layers in the first to third organic light emitting diodes OLED-R, OLED-G, and OLED-B may formed as a single body. The single-bodied electro control layers in the first to third organic light emitting diodes OLED-R, OLED-G, and OLED-B may be defined as a common electron control layer.

In an implementation, the electron control layer ECL may include at least one of an electron transport layer or an electron injection layer. Such functional layers in the electron control layer ECL may be formed by using various methods, e.g., vacuum deposition, spin coating, casting, Langmuir-Blodgett, inkjet printing, laser printing, laser induced thermal imaging (LITI), etc.

The cathode E2 may be disposed on the hole control layer HCL. The cathode E2 may include first to third portions E2-R, E2-G, and E2-B (hereinafter, referred to as first to third cathodes) that correspond to the first to third light emitting regions PXA-R, PXA-G, and PXA-B. The cathode E2 may be formed in the first to third light emitting regions PXA-R, PXA-G, and PXA-B as well as in the non-light emitting region NPXA. In an implementation, the cathode E2 may be formed through a deposition operation by using the open mask. In an implementation, the cathodes of the first to third light emitting diodes OLED-R, OLED-G, and OLED-B may be formed as a single body. The single-bodied cathodes in the first to third light emitting diodes OLED-R, OLED-G, and OLED-B may be defined as a common electrode.

The cathode E2 may be, e.g., a transmissive electrode, a transflective electrode, or a reflective electrode. In an implementation, the transmissive cathode E2 may include Li, Liq, Ca, LiF/(Ca, LiF/Al, Al, Mg, BaF, Ba, Ag, or compounds or mixtures thereof (e.g., a mixture of Ag and Mg). In an implementation, the transflective electrode or reflective cathode E2 may include Ag, Liq, Mg, Al, Pt, Pd, Au, Ni, Nd, Ir, Cr, Li, Ca, LiF/Ca, LiF/Al, Mo, Ti, or compounds or mixtures thereof (e.g., a mixture of Ag and Mg). In an implementation, the transflective electrode or reflective cathode E2 may have a multi-layered structure including the reflective layer or transflective layer that is made of such materials as described above, or including the transparent conductive layer that is made of ITO, IZO, ZnO, ITZO, etc.

In an implementation, the cathode E2 may include an auxiliary electrode (or an auxiliary line). The auxiliary electrode is an electrode for preventing a voltage drop and may include, e.g., ITO, IZO, ZnO, or ITZO, and/or may also include Mo, Ti, or Ag.

The top emission type organic light emitting diode may include the reflective anode, and the transmissive electrode or transflective cathode. The top emission type organic light emitting diode may include the transmissive or transflective anode, and the reflective cathode.

Figure 6A:
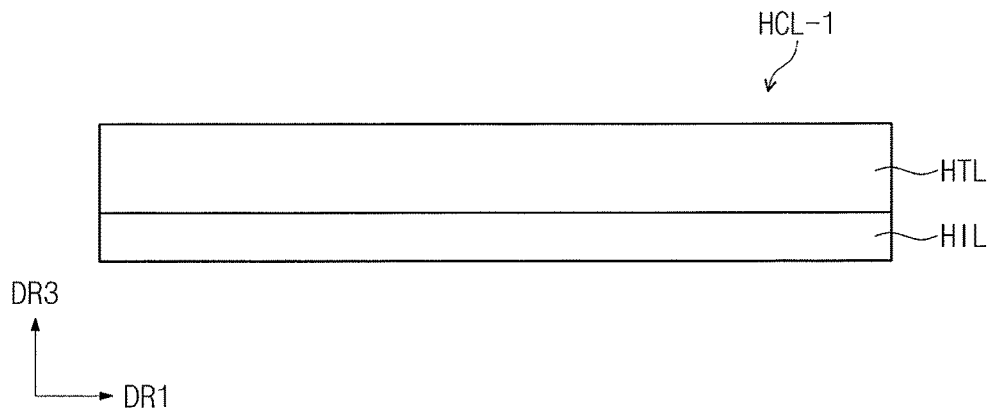
FIGS. 6A to 6C illustrate sectional views of a hole control layer according to an embodiment.
Figure 6B:
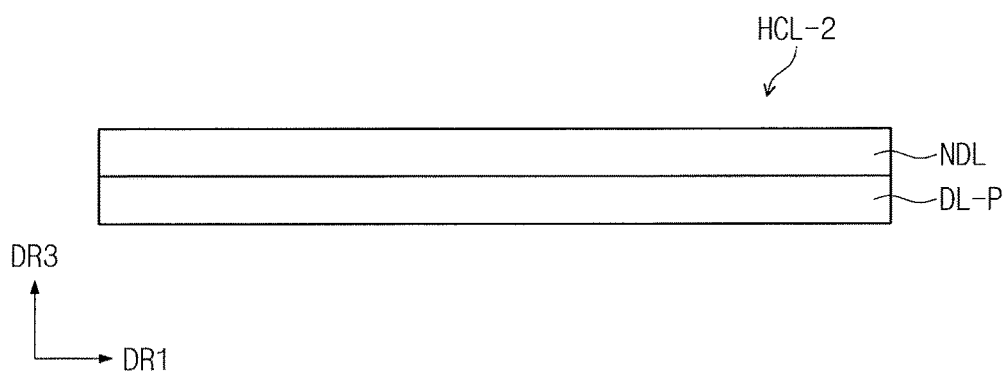
Figure 6C:
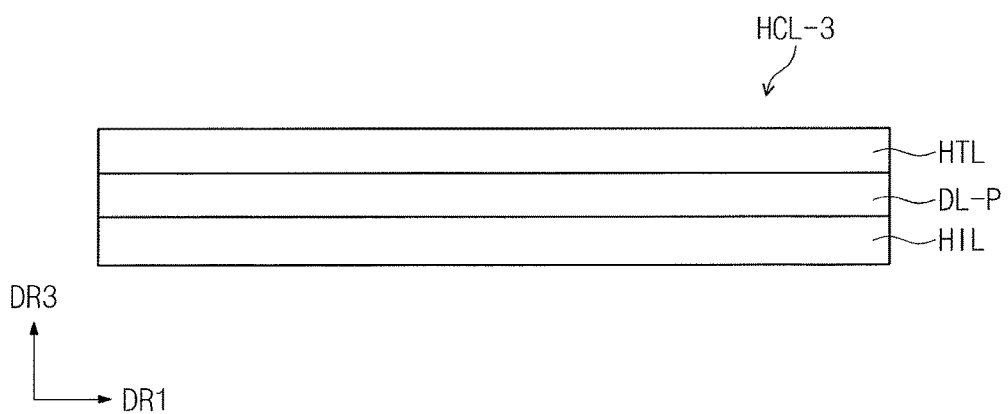

FIGS. 6A to 6C illustrate sectional views of the hole control layers HCL-1, HCL-2, and HCL-3 according to an embodiment. Hereinafter, the hole control layers HCL-1, HCL-2, and HCL-3 will be described in more detail with reference to FIGS. 6A to 6C. The hole control layers HCL-1, HCL-2, and HCL-3 that are described below may be used as the hole control layer HCL in FIG. 5.

As illustrated in FIG. 6A, the hole control layer HCL-1 may include the hole injection layer HIL, and the hole transport layer HTL on the hole injection layer HIL in the thickness direction DR3 of the hole control layer HCL-1.

The hole injection layer HIL may include, e.g., a phthalocyanine compound such as copper a phthalocyanine, etc., or may include N,N'-diphenyl-N,N'-bis-[4-(phenyl-m-tolyl-amino)-phenyl]-biphenyl-4,4'-diamine (DNTPD), 4,4',4"-tris(3-methylphenylphenylamino) triphenylamine (m-MTDATA), 4,4'4"-Tris(N,N-diphenylamino)triphenylamine (TDATA), 4,4',4"-tris{N,-(2-naphthyl)-N-phenylamino}-triphenylamine (2TNATA), Poly(3,4-ethylenedioxythiophene)/Poly(4-styrenesulfonate) (PEDOT/PSS), Polyaniline/Dodecylbenzenesulfonic acid), PANI/CSA(Polyaniline/Camphor sulfonicacid (PANI/DBSA), (Polyaniline)/Poly(4-styrenesulfonate) (PANI/PSS), etc.

The hole transport layer HTL may include, e.g., a carbazole derivative such as N-phenylcarbazole, polyvinyl carbazole etc., a fluorine derivative, N,N'-bis(3-methylphenyl)-N,N'-diphenyl-[1,1-biphenyl]-4,4'-diamine (TPD), a triphenylamine derivative such as 4,4',4"-tris(N-carbazolyl) triphenylamine (TCTA), etc., N,N'-di(1-naphthyl)-N,N'-diphenylbenzidine (NPB), 4,4'-Cyclohexylidene bis[N,N'-bis(4-methylphenyl)benzenamine] (TAPC), etc.

A thickness of the hole injection layer HIL may be, e.g., about 50 to about 2,000 Å, and/or a thickness of the hole transport layer HTL may be, e.g., about 100 to about 2,000 Å. When the thickness of the hole transport layer HCL-1 falls within the described range, a sufficiently satisfactory hole transport property may be realized without an effective increase in the driving voltage.

In an implementation, the thickness of the hole injection layer HIL may be about 50 to about 200 Å, and the thickness of the hole transport layer HTL may be about 100 to about 500 Å. In an implementation, the hole injection layer may be omitted. In an implementation, the hole control layer may include a hole injection layer that is doped with a p-type dopant. In an implementation, the hole transport layer may be omitted in the hole control layer. In an implementation, the thickness of the hole injection layer which is doped with the p-type dopant may be about 100 to about 2,000 Å.

As illustrated in FIG. 6B, the hole control layer HCL-2 may include, e.g., a doped layer DL-P, and an undoped layer NDL on the doped layer DL-P in the thickness direction of the hole control layer HCL-2. In an implementation, the undoped layer NDL may include a hole control material (hole transport material and/or hole injection material). The hole control material has been described above, and further repeated description thereof may be omitted.

In an implementation, the doped layer DL-P may include a hole control material and a hole generating material. The hole generating material may be uniformly or non-uniformly distributed within the hole control material. The hole generating material may be, e.g., p-type dopant. In an implementation, the p-type dopant may include, e.g., a quinone derivative, a metal oxide, or a cyano group-containing compound. For example, the p-type dopant may include a quinone derivative such as tetracyanoquinodimethane (TCNQ) or 2,3,5,6-tetrafluoro-tetracyanoquinodimethane (F4-TCNQ), or a metal oxide such as tungsten oxide or molybdenum oxide.

The hole control layer HCL-2 that includes the doped layer DL-P and the undoped layer NDL may be formed through deposition. At an early stage in the deposition process, the dopant and hole control material may be concurrently deposited at a predetermined ratio to form the doped layer DL-P. After a middle stage of the deposition process, the hole control material may be deposited to form the undoped layer NDL.

A thickness of the doped layer DL-P may be, e.g., about 10% to about 30%, based on a total thickness of the hole control layer HCL-2 being 100%. In an implementation, the thickness of the doped layer DL-P may be about 30 to about 100 Å. A weight percentage of the dopant in the doped layer DL-P may be about 1 wt % to about 3 wt %, with respect to the mixture of the hole control material and dopant.

As illustrated in FIG. 6C, the hole control layer HCL-3 may include, e.g., a hole injection layer HIL, a doped layer DL-P, and a hole transport layer HTL sequentially laminated in the thickness direction DR3 of the hole control layer HCL-3. Each of the layers has been described above, and a repeated detailed description thereof may be omitted.

As described above, the hole injection efficiency may be increased because the hole control layers HCL-1, HCL-2, and HCL-3 may include the hole generating material (e.g., the p-type dopant). Thus, the emission efficiency of the organic light emitting diode may be improved.

In an implementation, the hole control layer according to an embodiment, in addition to the hole injection layer and hole transport layer, may further include an electron blocking layer. The electron blocking layer may help prevent the injection of electrons from the electron transport layer to the hole transport layer.

Figure 7:
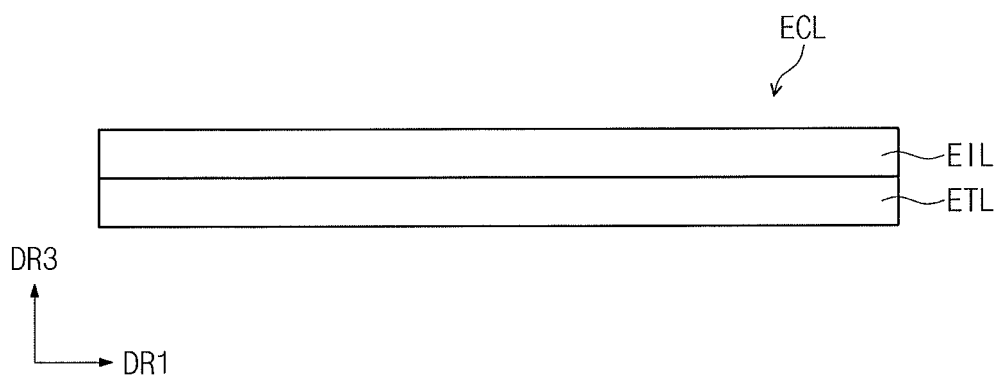
FIG. 7 illustrates a sectional view of an electron control layer according to an embodiment.

FIG. 7 illustrates a sectional view of the electron control layer ECL according to an embodiment. Hereinafter, the electron control layer ECL will be described in more detail with reference to FIG. 7. The electron control layer ECL that will be described below may also be used as the electron control layer ECL in FIG. 5.

As illustrated in FIG. 7, the electron control layer ECL may include, e.g., an electron injection layer EIL and an electron transport layer ETL under the electron injection layer EIL in the thickness direction DR3 of the electron control layer ECL.

In an implementation, the electron transport layer ETL may include, e.g., tris(8-hydroxyquinolinato)aluminum (Alq3), 1,3,5-Tri(1-phenyl-1H-benzo[d]imidazol-2-yl)phenyl (TPBi), 2,9-Dimethyl-4,7-diphenyl-1,10-phenanthroline (BCP), 4,7-Diphenyl-1,10-phenanthroline (Bphen), 3-(4-Biphenylyl)-4-phenyl-5-tert-butylphenyl-1,2,4-triazole (TAZ), 4-(Naphthalen-1-yl)-3,5-diphenyl-4H-1,2,4-triazole (NTAZ), 2-(4-Biphenylyl)-5-(4-tert-butylphenyl)-1,3,4-oxadiazole (tBu-PBD), Bis(2-methyl-8-quinolinolato-N1,O8)-(1,1'-Biphenyl-4-olato)aluminum (BAlq), berylliumbis(benzoquinolin-10-olate) (Bebq2), 9,10-di(naphthalene-2-yl)anthracene (ADN), or mixtures thereof. In an implementation, a thickness of the electron transport layer ETL may be about 100 to about 1,000 Å or, e.g., about 150 to about 500 Å. When the thickness of the electron transport layer ETL falls within such a range, a satisfactory electron transport property may be realized without effective increase in the driving voltage.

Examples of the electron injection layer EIL may include lithium fluoride (LiF), lithium quinolate (LiQ), lithium oxide ($Li_2O$), barium oxide (BaO), sodium chloride (NaCl), cesium fluoride (CsF), a lanthanum group metal such as ytterbium (Yb), a halogenated metal such as rubidium chloride (RbCl), rubidium iodide (RbI), etc. In an implementation, the electron injection layer EIL may further include an insulative organometallic salt insulated from an electron transport material. The organometallic salt may be a material which has the energy band gap of at least about 4 eV. Examples of the organometallic salt may include metal acetate, metal benzoate, metal acetoacetate, metal acetylacetonate, and metal stearate. In an implementation, the thickness of the electron injection layer EIL may be about 1 to about 100 Å, e.g., about 3 to about 90 Å. When the thickness of the electron injection layer EIL falls within such a range, satisfactory electron injecting property may be realized without an effective increase in the driving voltage.

In an implementation, the electron control layer ECL may further include a hole blocking layer. The hole blocking layer may include, e.g., 2,9-dimethyl-4,7-diphenyl-1,10-phenanthroline (BCP) and/or 4,7-diphenyl-1,10-phenanthroline (Bphen). In an implementation, a thickness of the hole blocking layer may be about 20 to about 1,000 Å, e.g., about 30 to about 300 Å. When the thickness of the hole blocking layer falls within such a range, good hole blocking property may be realized without an effective increase in the driving voltage.

For example, the electron control layer ECL may have a structure of an electron transport layer/electron injection layer or a hole blocking layer/electron transport layer/electron injection layer, which are successively laminated on the light emitting layers EML-R, EML-G, and EML-B (refer to FIG. 5). In an implementation, the electron control layer ECL may include a functional layer which is a mixture of at least two among an electron transport material, an electron injection material, and a hole blocking material.

FIGS. 8A, 8B, 9A, and 9B illustrate sectional views of pixels PX-1 to PX-4 according to an embodiment. Hereinafter, description is given of the pixels PX-1 to PX-4 according to an embodiment, with reference to FIGS. 8A to 9B. However, repeated detailed descriptions of configurations that are identical to configurations described with reference to FIGS. 1 to 7 may be omitted. Although not specifically illustrated, configurations described with reference to FIGS. 1 to 7 may be applied in like manner to the pixels PX-1 to PX4 which are illustrated in FIGS. 8A to 9B.

Figure 8A:
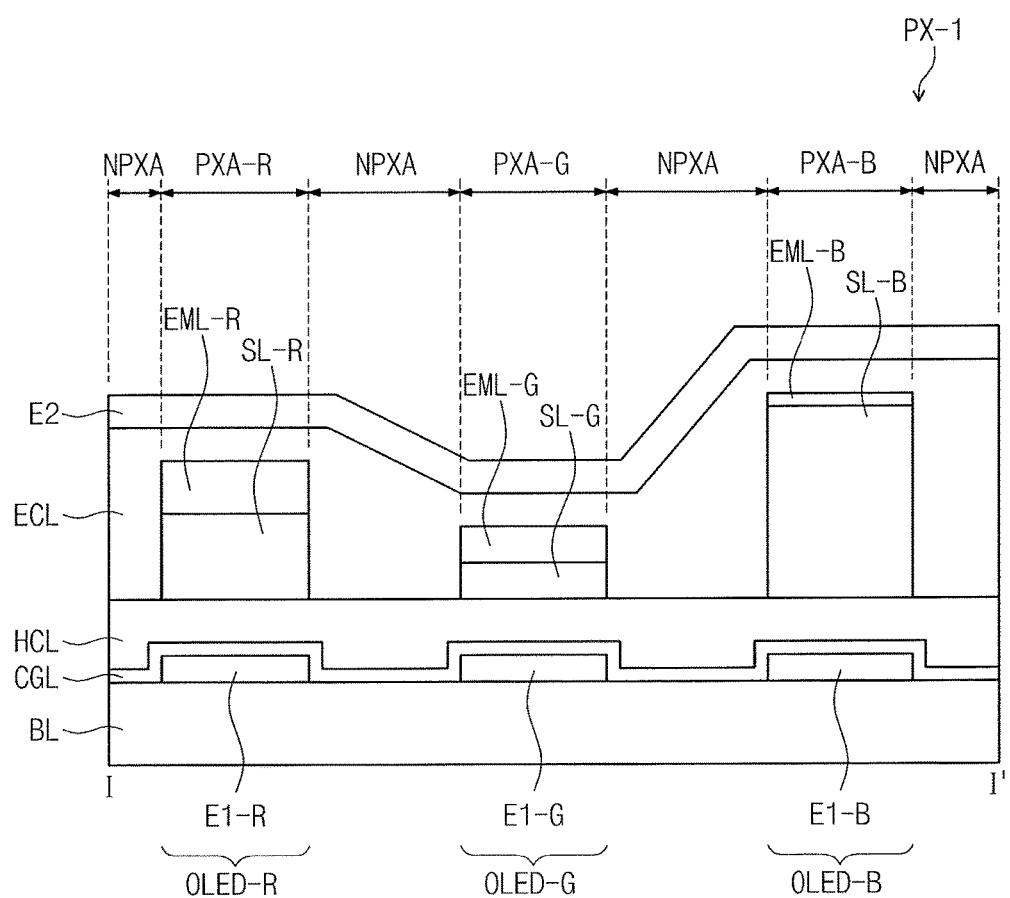
FIGS. 8A, 8B, 9A, and 9B illustrate sectional views of pixels according to an embodiment.
Figure 8B:
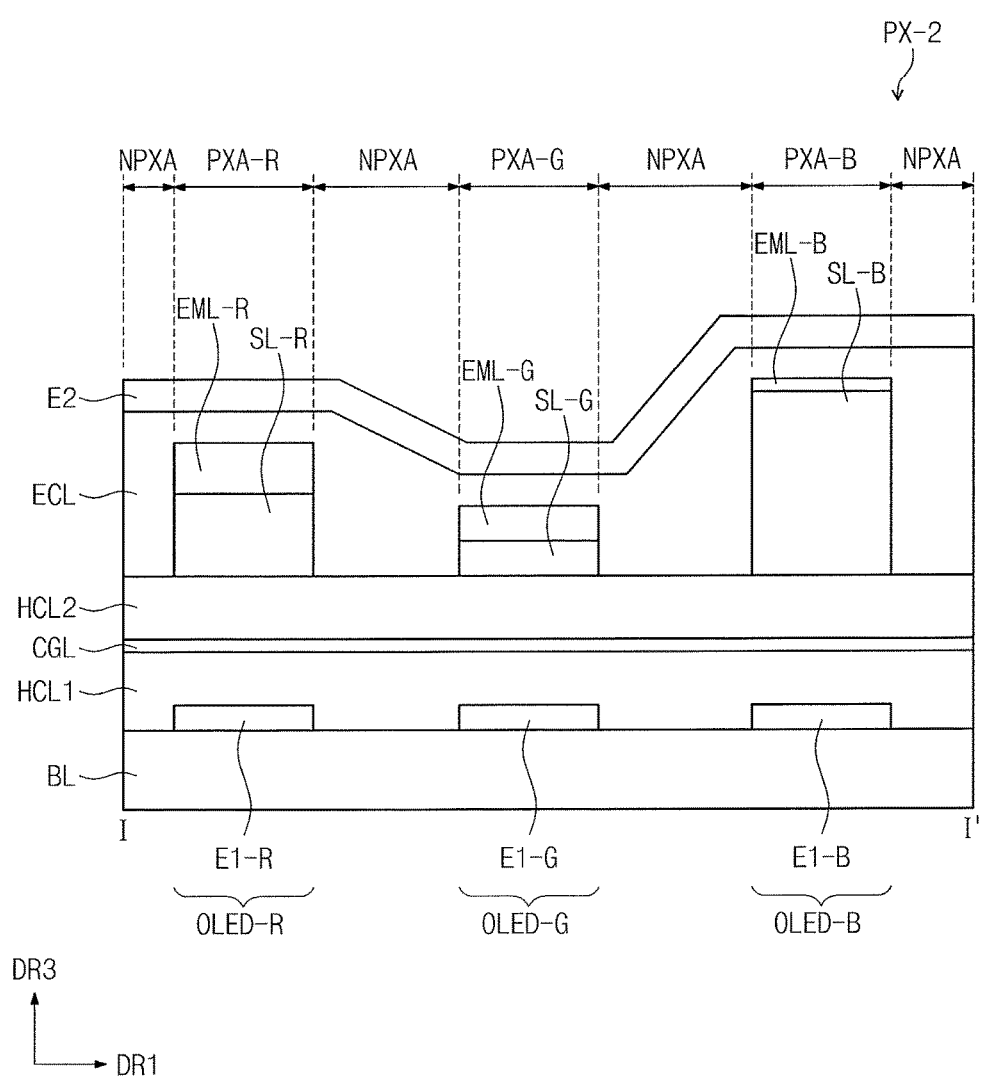

Referring to FIGS. 8A and 8B, each of the pixels PX-1 and PX2 may further include, e.g., an intermediate layer CGL. The intermediate layer CGL may generate an electric charge, e.g., a hole. The intermediate layer CGL may include at least one of hexacarbonitrile (HAT-CN), molybdenum trioxide ($MoO_3$), or fullerene ($C_{60}$). The hole injection efficiency may be increased by including the intermediate layer CGL that includes the above-described hole generating material. For example, the emission efficiency of the organic light emitting diode is improved. In an implementation, a thickness of the intermediate layer CGL may be, e.g., about 30 to about 100 Å.

As illustrated in FIG. 8A, the intermediate layer CGL may be between hole control layer HCL and the first to third anodes E1-R, E1-G, and E1-B. The hole control layer HCL may include at least one of the hole injection layer or the hole transport layer. The hole control layer HCL may include a mixture of hole injection material and hole transport material.

As illustrated in FIG. 8B, the intermediate layer CGL may be disposed between the first hole control layer HCL1 and the second hole control layer HCL2. Each of the first hole control layer HCL1 and the second hole control layer HCL2 may include at least one of the hole injection layer or the hole transport layer. When the first hole control layer HCL1 is the hole injection layer, the second hole control layer HCL2 may be the hole transport layer.

Figure 9A:
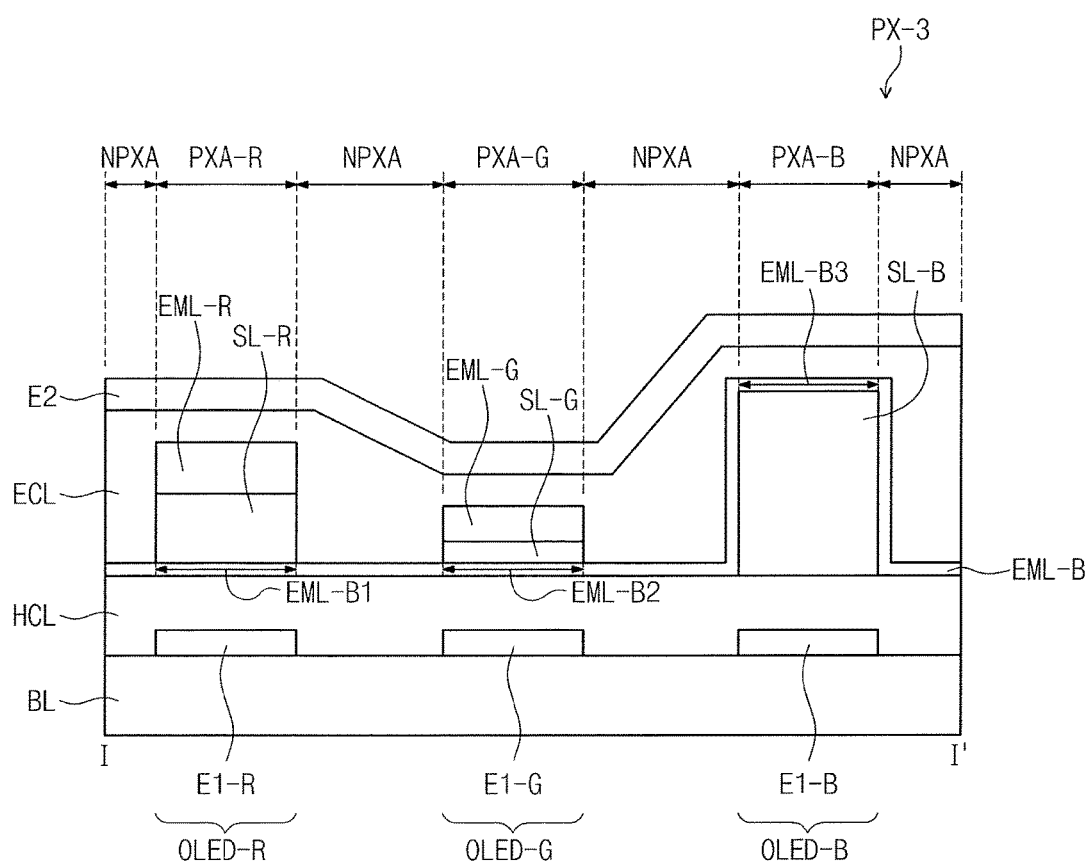
Figure 9B:
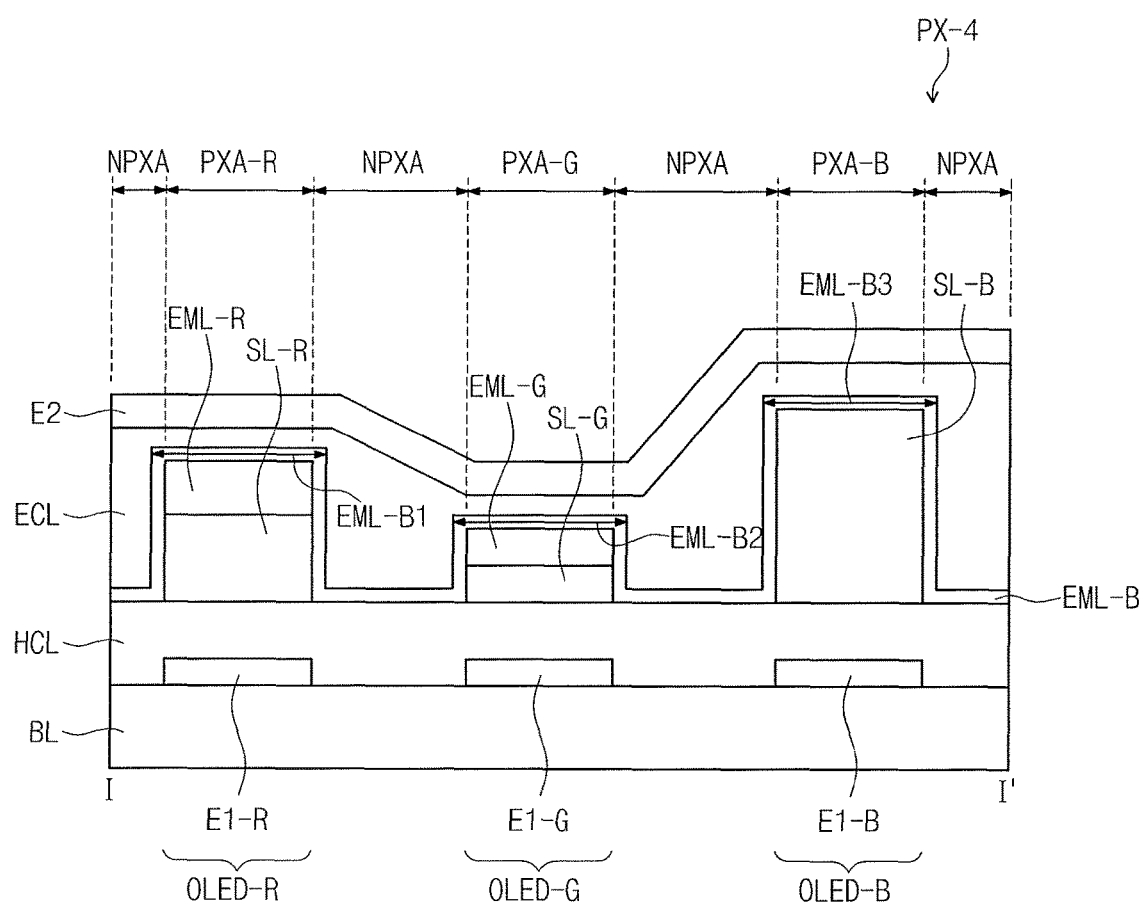

As illustrated in FIGS. 9A and 9B, the third light emitting layer EML-B may overlap with (e.g., may commonly extend across) the first to third light emitting regions PXA-R, PXA-G, and PXA-B and the non-light emitting region NPXA. The third light emitting layer EML-B may include first to third portions EML-B1, EML-B2, and EML-B3 that respectively overlap with the first to third light emitting regions PXA-R, PXA-G, and PXA-B. For example, the third light emitting layer EML-B may be disposed to entirely overlap with the pixels PX-3 and PX-4.

Planar arrangement of the third light emitting layer EML-B will be described in more detail with reference to FIG. 4A. The third light emitting layer EML-B may include vertically extending (in the second directional axis DR2) striped patterns that respectively overlap with the first to third light emitting regions PXA-R, PXA-G, and PXA-B. In an implementation, the third light emitting layer EML-B may include horizontally extending (in the first directional axis DR1) striped patterns that respectively overlap with the first to third light emitting regions PXA-R, PXA-G, and PXA-B. The third light emitting layer EML-B may also overlap with the entire plane defined by the first directional axis DR1 and second directional axis DR2 of FIGS. 4A and 4B.

As illustrated in FIG. 9A, the first and second portions EML-B1 and EML-B2 of the third light emitting layer EML-B may be disposed on the hole control layer HCL. The first portion EML-B1 may be between the hole control layer HCL and the resonance control layer SL-R of the first organic light emitting diode OLED-R, and the second portion EML-B2 may be between the hole control layer HCL and the resonance control layer SL-G of the second organic light emitting layer OLED-G. The third portion EML-B3 of the third light emitting layer EML-B may be between the resonance control layer SL-B of the third organic light emitting diode OLED-B and the electron control layer ECL. Other portions that overlap with the non-light emitting region NPXA of the third light emitting layer EML-B may be on the same layer as the first and second portions EML-B1 and EML-B2 of the third light emitting layer EML-B.

As illustrated in FIG. 9B, the first portion EML-B1 of the third light emitting layer EML-B may be between the first light emitting layer EML-R and the electron control layer ECL, and the second portion EML-B2 may be between the second light emitting layer EML-G and the electron control layer ECL. The third portion EML-B3 of the third light emitting layer EML-B may be between the resonance control layer SL-B of the third organic light emitting diode OLED-B and the electron control layer ECL. Other portions that overlap with the non-light emitting region NPXA of the third light emitting layer EML-B may be disposed on the same layer as the first and second portions EML-B1 and EML-B2 of the third light emitting layer EML-B.

As illustrated in FIGS. 9A and 9B, the third light emitting layer EML-B may be deposited to entirely overlap with the pixels PX-3 and PX-4 by using an open mask. For example, the fine metal mask (FMM) may not be used. Consequently, the manufacturing costs for the organic light emitting display device may be reduced.

The third light emitting layer EML-B illustrated in FIGS. 9A and 9B may include an ambipolar compound. The ambipolar compound may be a compound that is excellent in both hole transporting and electron transporting abilities. The ambipolar compound may include, e.g., anthracene, 9-phenylanthracene, 9,10-diphenylanthracene (DPA), or benzo(B)naphto(2,3-D)furan.

Referring to FIG. 9A, the ambipolar compound may more effectively provide holes to the first light emitting layer EML-R and second light emitting layer EML-G, and the driving voltage may be reduced. Referring to FIG. 9B, the ambipolar compound may more effectively provide electrons to the first light emitting layer EML-G and second light emitting layer EML-G, and the driving voltage may be reduced.

Referring to FIG. 9A, the first resonance control layer SL-R may have a lowest unoccupied molecular orbital (LUMO) level that is at least 0.2 eV higher than (e.g., that is 0.2 eV higher than) the first light emitting layer EML-R, and the second resonance control layer SL-G may have a LUMO level that is at least 0.2 eV higher than (e.g., that is 0.2 eV higher than) the second light emitting layer EML-G. Electrons may thus be prevented from being transported from the first light emitting layer EML-R and second light emitting layer EML-G to the third light emitting layer EML-B. Consequently, even when the first and second portions EML-B1 and EML-B2 of the third light emitting layer EML-B are deposited on areas other than the third light emitting region PXA-B, an error of blue light being emitted from the first light emitting region PXA-R and the second light emitting region PXA-G may not occur.

Referring to FIGS. 9A and 9B, an energy gap required for light emission by the first and second light emitting layers EML-R and EML-G may be smaller than an energy gap required for light emission by the third light emitting layer EML-B. Thus, even when the first and second portions EML-B1 and EML-B2 of the third light emitting layer EML-B ire deposited on areas other than the third light emitting region PXA-B, an error of blue light being emitted from the first light emitting region PXA-R and the second light emitting region PXA-G may not occur. For example, the energy gaps required for light emission by the first and second light emitting layers EML-R and EML-G may be 2.0 eV and 2.4 eV, respectively, and the energy gap required for light emission by the third light emitting layer EML-B may be 2.7 eV or larger.

Figure 10A:
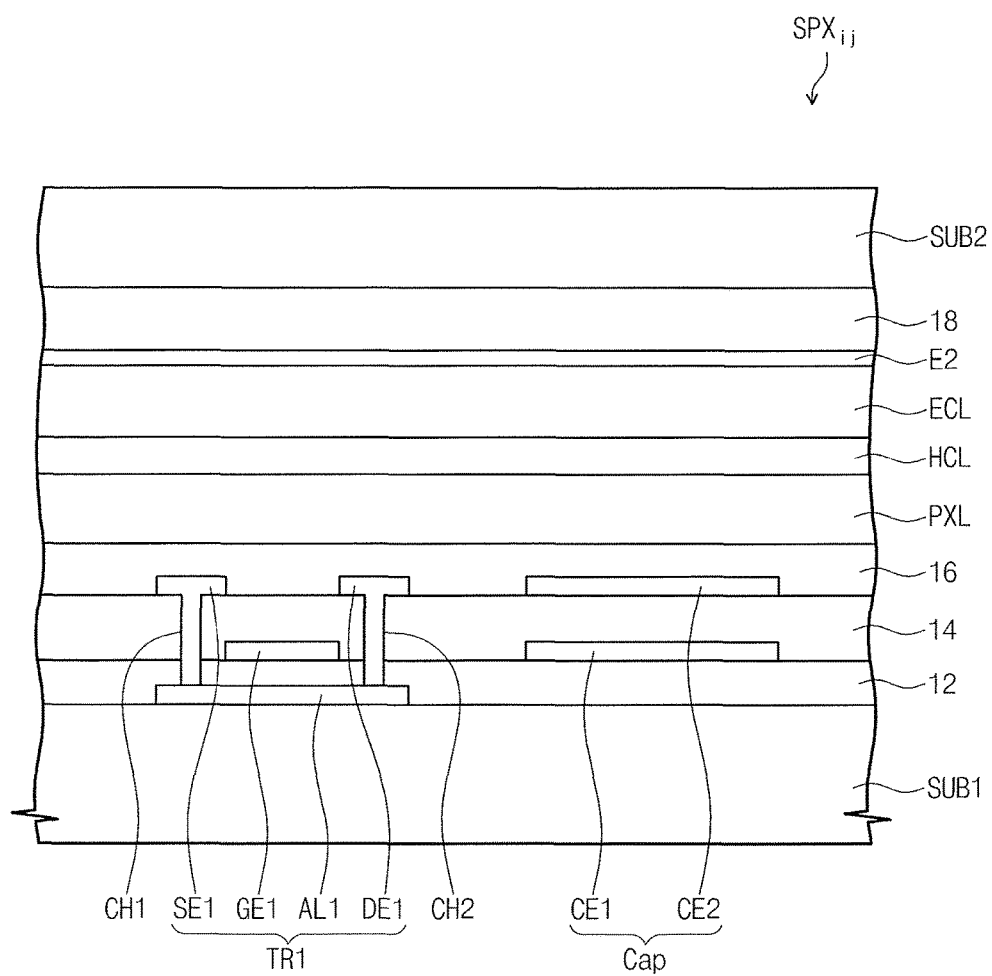
FIGS. 10A and 10B illustrate sectional views of organic light emitting display panels according to an embodiment.
Figure 10B:
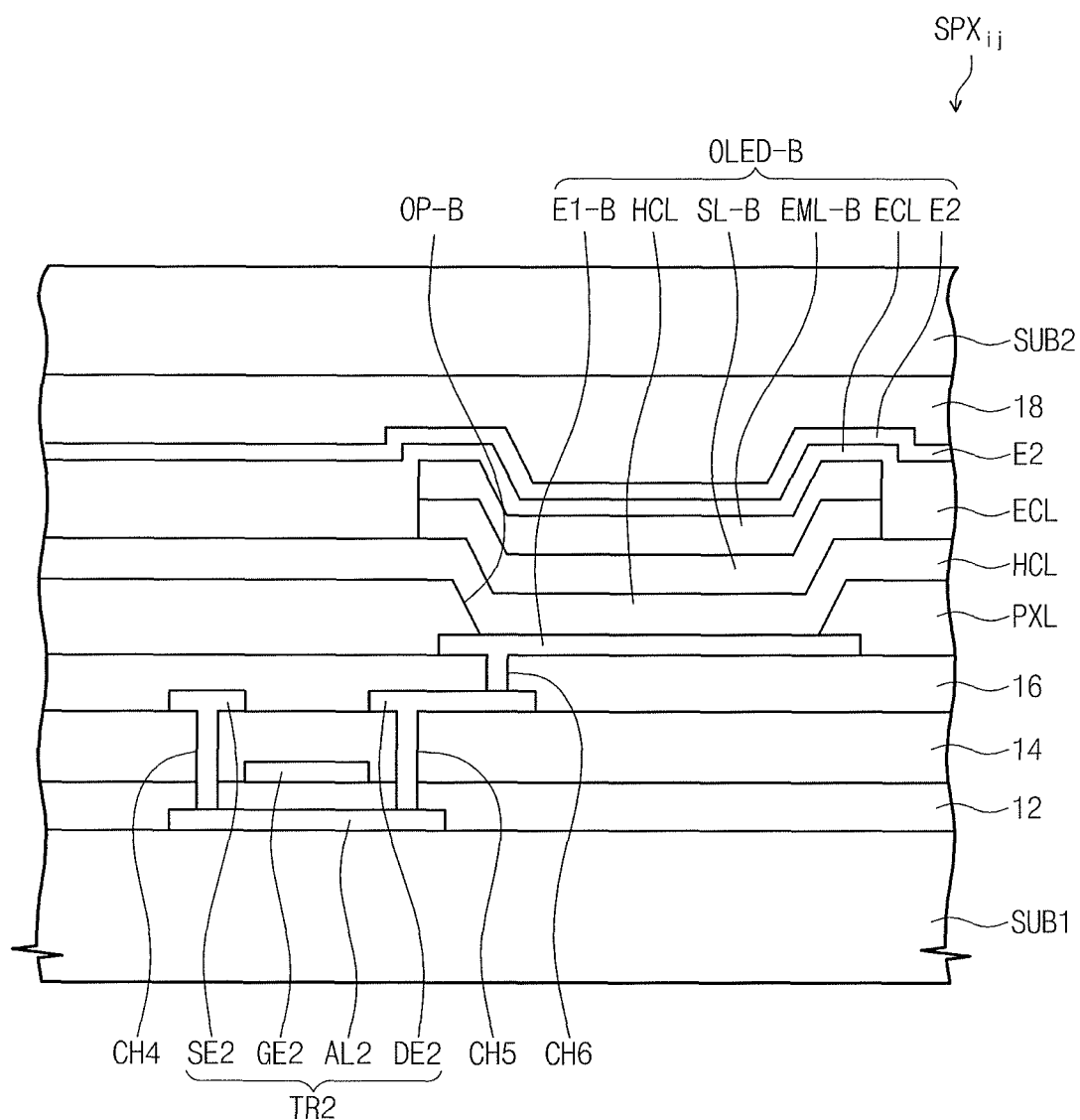

FIGS. 10A and 10B illustrate sectional views of the organic light emitting display panels DP (refer to FIG. 2) according to an embodiment. The sectional views illustrated in FIGS. 10A and 10B respectively correspond to portions of the subpixel SPXij represented by the equivalent circuit illustrated in FIG. 2. The organic light emitting display panel DP is described with reference to the subpixel SPXij.

The organic light emitting display panel DP may include a base member SUB1, functional layers 12, 14, 16, PXL, and 18, signal lines SLi, DLj, and PL (refer to FIG. 2), the subpixel SPXij, and an encapsulation member SUB2. The configurations of the base member SUB1, functional layers 12, 14, 16, PXL, and 18, signal lines SLi, DLj, and PL, subpixel SPXij, and encapsulation member SUB2 may be modified according to the objective of the organic light emitting display panel DP.

The base member SUB1 may include flexible plastic substrates made of polyamide or the like, glass substrates, metal substrates, etc. A semiconductor pattern AL1 (hereinafter, a first semiconductor pattern) of the first transistor TR1 and a semiconductor pattern AL2 (hereinafter, a second semiconductor pattern) of the second transistor TR2 may be disposed on the base member SUB1. The first semiconductor pattern AL1 and the second semiconductor pattern AL2 may include amorphous silicon formed at a low temperature. The first and second semiconductor patterns AL1 and AL2 may also include metal oxide semiconductors. Although not specifically illustrated, additional functional layers may be disposed on one surface of the base member SUB1. The functional layers may include at least one of a barrier layer or a buffer layer. The first and second semiconductor patterns AL1 and AL2 may be disposed on the barrier layer or the buffer layer.

A first insulating layer 12 that covers the first and second semiconductor patterns AL1 and AL2 may be disposed on the base member SUB1. The first insulating layer 12 may include organic films and/or inorganic films. The first insulating layer 12 may specifically include a plurality of inorganic thin films. The plurality of inorganic thin films may include silicon nitride layers and silicon oxide layers.

The scan line SLi may be disposed on the first insulating layer 12. A gate electrode GE1 (hereinafter, a first gate electrode) of the first transistor TR1 and a gate electrode GE2 (hereinafter, a second gate electrode) of the second transistor TR2 may be disposed on the first insulating layer 12.

A first electrode CE1 of the capacitor Cap may be disposed on the first insulating layer 12. The first electrode CE1 may be manufactured through the same photolithographic process as the scan line SLi. For example, the first electrode CE1 may be made of the same material as the scan line SLi.

A second insulating layer 14 may be disposed on the first insulating layer 12 to cover the first gate electrode GE1, the second gate electrode GE2, and the first electrode CE1. The second insulating layer 14 may include organic films and/or inorganic films. The second insulating layer 14 may specifically include a plurality of inorganic thin films. The plurality of inorganic thin films may include silicon nitride layers and silicon oxide layers.

The source line DLj and power line PL may be disposed on the second insulating layer 14. A source electrode SE1

(hereinafter a first source electrode) and drain electrode DE1 (hereinafter, a first drain electrode) of the first transistor TR1 may be disposed on the second insulating layer 14. A source electrode SE2 (hereinafter, a second source electrode) and drain electrode DE2 (hereinafter, a second drain electrode) of the second transistor TR2 may be disposed on the second insulating layer 14. The first source electrode SE1 may be branched from the source line DLj. The second source electrode SE2 may be branched from the power line PL.

A second electrode CE2 of the capacitor Cap may be disposed on the second insulating layer 14. The second electrode CE2 may be manufactured through the same photolithographic process and made of the same material as the source line DLi and power line PL.

The first source electrode SE1 and the first drain electrode DE1 may be respectively connected to the first semiconductor pattern AL1 through a first through-hole CH1 and a second through-hole CH2 which penetrate the first and second insulating layers 12 and 14. The first drain electrode DE1 may be electrically connected to the first electrode CE1. For example, the first drain electrode DE1 may be connected to the first electrode CE1 through the through-hole (not shown) which penetrates the second insulating layer 14. The second source electrode SE2 and the second drain electrode DE2 are respectively connected to the second semiconductor pattern AL2 through a fourth through-hole CH4 and a fifth through-hole CH5 which penetrate the first insulating layer 12 and the second insulating layer 14. In another embodiment, the first transistor TR1 and the second transistor TR2 may be implemented as a bottom gate configuration.

A third insulating layer 16 may be disposed on the second insulating layer 14 to cover the first source electrode SE1, the first drain electrode DE1, the second source electrode SE2, and the second drain electrode DE2. The third insulating layer 16 may include organic and/or inorganic films. The third insulating layer 16 may specifically include organic material to provide a flat surface.

The organic light emitting diode OLED-B may be disposed on the third insulating layer. The organic light emitting diode OLED-B may be any one of the organic light emitting diodes described with reference to FIGS. 5 to 9B. The third light emitting diode OLED-B of FIG. 5 is exemplarily illustrated in FIG. 10B.

The anode E1-B may be connected to the second drain electrode DE2 through a sixth through-hole CH6 that penetrates the third insulating layer 16. An opening OP-B in a pixel defining film PXL exposes at least a portion of the anode E1-B. A protective layer 18 may be disposed on the cathode E2. The protective layer 18 protects the cathode E2 from external moisture. The protective layer 18 may have a predetermined refractive index to help improve the light extraction efficiency and help prevent external light reflection.

The encapsulation member SUB2 may be disposed on the protective layer 18. In an implementation, the encapsulation member SUB2 may be substituted by a plurality of thin-film encapsulation layers. In an implementation, the protective film 18 may be omitted. In an implementation, the protective film may be disposed on an external side surface (the rear surface of FIGS. 11A and 11B) of the base member SUB1. The protective film may protect the subpixel SPXij from external impact.

Figure 11:
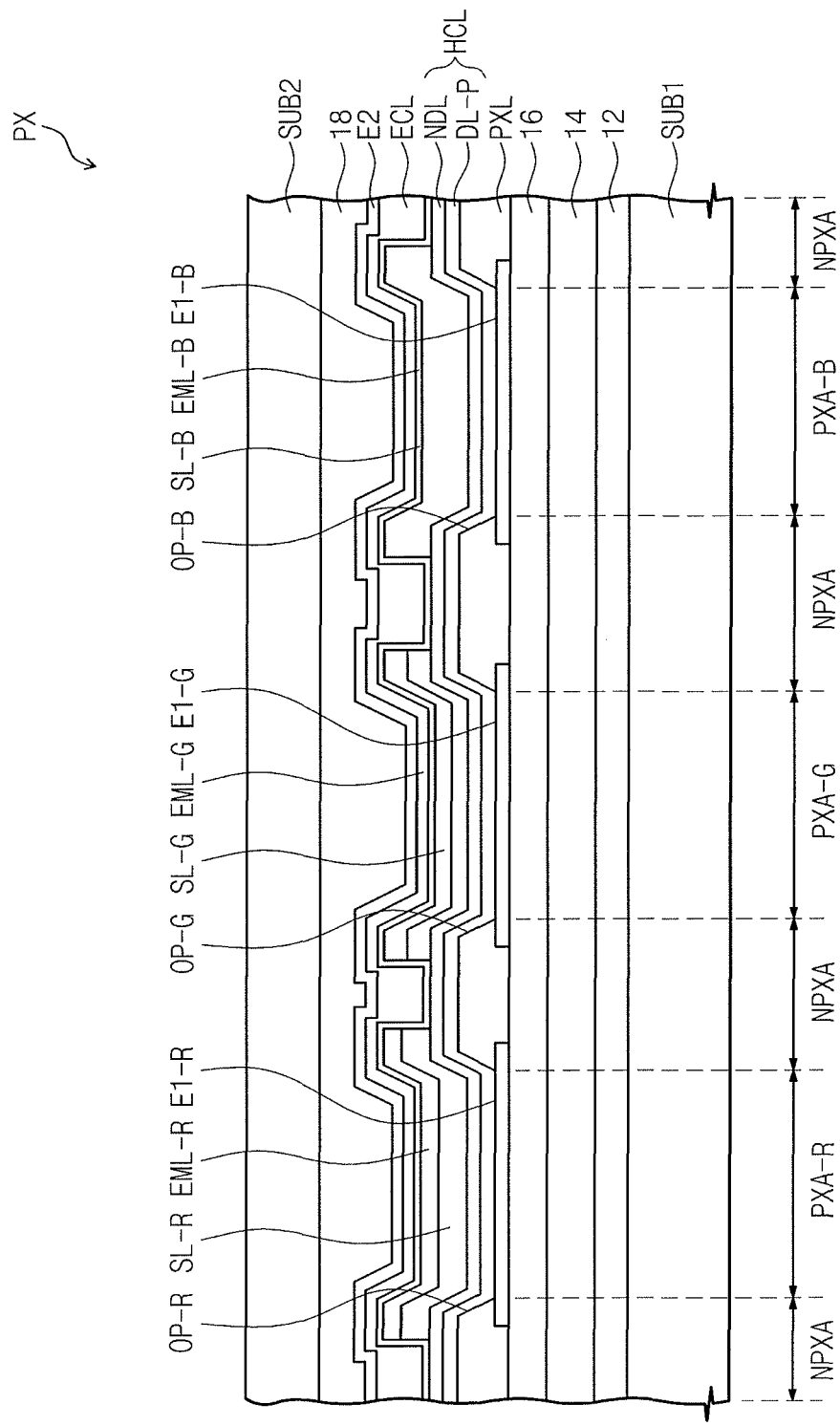
FIG. 11 illustrates a sectional view of an organic light emitting display panel according to an embodiment.

FIG. 11 illustrates a sectional view of the organic light emitting display panel according to an embodiment. FIG. 11 illustrates a sectional view of the organic light emitting display panel taken along line I-I' of FIG. 4A. The configuration of areas below the third insulating layer 16 in FIG. 11 is illustrated schematically. The third insulating layer 16 may correspond to the base layer BL in FIG. 5.

The first to third anodes E1-R, E1-G, and E1-B may be disposed on the third insulating layer 16. The pixel defining film PXL in which the first to third openings OP-R, OP-G, and OP-B are defined may be disposed on the third insulating layer 16.

The hole control layer HCL (which contacts each of the first to third anodes E1-R, E1-G, and E1-B) may be disposed on the pixel defining film PXL. As described with reference to FIG. 6B, the hole control layer HCL may include the doped layer DL-P and the undoped layer NDL. The thickness of the doped layer DLP may be about 50 Å. The thickness of the undoped layer NDL may be about 200 Å.

The first resonance control layer SL-R may be disposed on the first light emitting region PXA-R in the hole control layer HCL, and the first light emitting layer EML-R may be disposed on the first resonance control layer SL-R. The thickness of the first resonance control layer SL-R may be about 150 Å, and the thickness of the first light emitting layer EML-R may be about 300 Å.

The second resonance control layer SL-G may be disposed on the second light emitting region PXA-G in the hole control layer HCL, and the second light emitting layer EML-G may be disposed on the second resonance control layer SL-G. The thickness of the second resonance control layer SL-G may be about 50 Å, and the thickness of the second light emitting layer EML-G may be about 200 Å.

The third resonance control layer SL-B may be disposed on the third light emitting region PXA-B of the hole control layer HCL, and the third light emitting layer EML-B may be disposed on the third resonance control layer SL-B. The thickness of the third resonance control layer SL-B may about 1,120 Å, and the thickness of the third light emitting layer EML-B may be about 150 Å. As described with reference to FIG. 9B, the third light emitting layer EML-B may also be disposed on the first light emitting region PXA-R and the second light emitting region PXA-G.

The third electron control layer ECL may be disposed on the third light emitting layer EML-B. The electron control layer ECL may be disposed in the first to third light emitting regions PXA-R, PXA-G, and PXA-B and the non-light emitting region NPXA. The thickness of the electron control layer ECL may be about 250 Å.

Accordingly, in the present embodiment, the resonance length of the first light emitting diode OLED-R may be about 1,100 Å, the resonance length of the second light emitting diode OLED-G may be about 900 Å, and the resonance length of the third light emitting diode OLED-B may be about 1,770 Å.

The cathode E2 may be disposed on the electron control layer ECL, and the protective layer 18 and encapsulation member SUB2 may be disposed on the cathode E2. FIG. 11 illustrates the organic light emitting display device DP that includes the pixel PX according to an embodiment. The pixel PX may be substituted by the pixels PX-1 to PX-4 that are described with reference to FIGS. 5 to 9B, or by combinations thereof.

Accordingly, each of first and second organic light emitting diodes may have a first order resonance structure, and the thicknesses of a resonance control layer and a light emitting layer in the first and second organic light emitting diodes may be thinner. Consequently, material used in the resonance control layer and light emitting layer may be reduced. Moreover, the driving efficiencies of the first and second organic light emitting diode may be improved. For the first organic light emitting diode, the driving voltage may be reduced and the current efficiency is increased. For the second light emitting diode, the driving voltage may be reduced and the current efficiency may be maintained at the same level as an organic light emitting diode with a second order resonance structure.

A light emitting layer that emits blue light may be deposited to overlap with multiple light emitting regions and a non-light emitting region by using an open mask. For example, a fine metal mask (FMM) may not be used. Consequently, the manufacturing cost for an organic light emitting display device is reduced.

The embodiments may provide an organic light emitting pixel having an improved display quality.

The embodiments may provide an organic light emitting pixel having a reduced manufacturing cost.

The embodiments may provide an organic light emitting display device which includes the organic light emitting pixel.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting pixel, comprising:
   a first organic light emitting diode to emit light with a $n^{th}$ order resonance mode of a first wavelength, n being a natural number of at least 1;
   a second organic light emitting diode to emit light with the $n^{th}$ order resonance mode of a second wavelength, the second wavelength being shorter than the first wavelength; and
   a third organic light emitting diode to emit light with a $m^{th}$ order resonance mode of a third wavelength, the third wavelength being shorter than the first and second wavelengths, and m being a natural number that is larger than n.

2. The organic light emitting pixel as claimed in claim 1, wherein:
   the first organic light emitting diode includes a first anode, a first hole control layer on the first anode, a first resonance control layer on the first hole control layer, a first light emitting layer on the first resonance control layer, a first electron control layer on the first light emitting layer, and a first cathode on the first electron control layer;
   the second organic light emitting diode includes a second anode, a second hole control layer on the second anode, a second resonance control layer on the second hole control layer, a second light emitting layer on the second resonance control layer, a second electron control layer on the second light emitting layer, and a second cathode on the second electron control layer, the second cathode being a single body with the first cathode; and
   the third organic light emitting diode includes a third anode, a third hole control layer on the third anode, a third resonance control layer on the third hole layer, a third light emitting layer on at least the third resonance control layer, a third electron control layer on the third light emitting layer, and a third cathode on the third electron control layer, the third cathode being a single body with the second cathode.

3. The organic light emitting pixel as claimed in claim 2, wherein:
   the first hole control layer, the second hole control layer, and the third hole control layer are a single body, and
   the first hole control layer, the second hole control layer, and the third hole control layer being the single body is a common hole control layer.

4. The organic light emitting pixel as claimed in claim 3, wherein the common hole control layer includes a hole transport layer that transports holes to the first to third light emitting layers.

5. The organic light emitting pixel as claimed in claim 4, wherein:
   the hole transport layer includes a doped layer and an undoped layer that are divided in a thickness direction of the hole transport layer, the undoped layer being closer to the first to third light emitting layers than is the doped layer,
   the doped layer includes a p-type dopant and a hole transport material, and
   the undoped layer includes a hole transport material.

6. The organic light emitting pixel as claimed in claim 4, wherein the common hole control layer further includes a hole injection layer that injects holes from the first to third anodes to the hole transport layer.

7. The organic light emitting pixel as claimed in claim 3, further comprising an intermediate layer that is between the common hole control layer and the first to third anodes and that generates holes.

8. The organic light emitting pixel as claimed in claim 7, wherein the intermediate layer includes hexaazatriphenylene hexacarbonitrile, molybdenum trioxide, or fullerene.

9. The organic light emitting pixel as claimed in claim 3, wherein:
   the first electron control layer, the second electron control layer, and the third electron control layer are a single body, and
   the first electron control layer, the second electron control layer, and the third electron control layer being the single body are a common electron control layer.

10. The organic light emitting pixel as claimed in claim 9, wherein the third light emitting layer includes:
    a first portion that overlaps with the first light emitting layer,
    a second portion that overlaps with the second light emitting layer, and
    a third portion that overlaps with the third resonance control layer.

11. The organic light emitting pixel as claimed in claim 10, wherein the third light emitting layer includes an ambipolar compound.

12. The organic light emitting pixel as claimed in claim 11, wherein the ambipolar compound includes anthracene, 9-phenylanthracene, 9,10-diphenylanthracene, or benzo(B)naphto(2,3-D)furan.

13. The organic light emitting pixel as claimed in claim 10, wherein:
    the first portion is between the common hole control layer and the first light emitting layer,
    the second portion is between the common hole control layer and the second light emitting layer, and the third portion is between the third light emitting layer and the common electron control layer.

14. The organic light emitting pixel as claimed in claim 13, wherein the first resonance control layer has a LUMO level that is at least 0.2 eV higher than that of the first light emitting layer.

15. The organic light emitting pixel as claimed in claim 10, wherein:
the first portion is between the common electron control layer and the first light emitting layer,
the second portion is between the common electron control layer and second light emitting layer, and
the third portion is between the third light emitting layer and the common electron control layer.

16. The light emitting pixel as claimed in claim 1, wherein:
the first wavelength is about 620 to about 750 nm,
the second wavelength is about 495 to about 570 nm, and
the third wavelength is about 450 to about 495 nm.

17. The light emitting pixel as claimed in claim 1, wherein n is 1 and m is 2.

18. The light emitting pixel as claimed in claim 1, wherein:
the first organic light emitting diode has a first resonance length (Lc1) according to the following Equation 1:

$$Lc1 = \frac{\lambda 1}{2Nc1} \times n \qquad \text{(Equation 1)}$$

the second organic light emitting diode has a second resonance length (Lc2) according to the following Equation 2:

$$Lc2 = \frac{\lambda 2}{2Nc2} \times n, \qquad \text{(Equation 2)}$$

and
the third organic light emitting diode has a third resonance length (Lc3) according to the following Equation 3, $$Lc3 = \frac{\lambda 3}{2Nc3} \times m \qquad \text{(Equation 3)}$$

wherein, in Equations 1 to 3,
Nc1 is a first refractive index of a first resonance structure that provides the first resonance length of the first organic light emitting diode, $\lambda 1$ is the first wavelength, Nc2 is a second refractive index of a second resonance structure that provides the second resonance length of the second organic light emitting diode, $\lambda 2$ is the second wavelength, Nc3 is a third refractive index of a third resonance structure that provides the third resonance length of the third organic light emitting diode, and $\lambda 3$ is the third wavelength.

19. The light emitting pixel as claimed in claim 18, wherein n is 1 and m is 2.

20. An organic light emitting display device having first to third light emitting regions and a non-light emitting region that is adjacent to the first to third light emitting regions, the device comprising:
a base layer;
a first organic light emitting diode on the base layer in the first light emitting region to emit light with a first order resonance mode of a first wavelength;
a second organic light emitting diode on the base layer in the second light emitting region to emit light with a first order resonance mode of a second wavelength, the second wavelength being shorter than the first wavelength; and
a third organic light emitting diode on the base layer in the third light emitting region to emit light with a second order resonance mode of a third wavelength, the third wavelength being shorter than the first and second wavelengths.

21. The organic light emitting display device as claimed in claim 20, further comprising a pixel defining film on the base layer, the pixel defining film including first to third openings respectively overlying the first to third light emitting regions.

22. The organic light emitting display device as claimed in claim 21, wherein:
the first organic light emitting diode includes a first anode in the first light emitting region, a first hole control layer on the first anode, a first resonance control layer on the first hole control layer, a first light emitting layer on the first resonance control layer, a first electron control layer on the first light emitting layer, and a first cathode on the first electron control layer,
the second organic light emitting diode includes a second anode in the second light emitting region, a second hole control layer on the second anode, a second resonance control layer on the second hole control layer, a second light emitting layer on the second resonance control layer, a second electron control layer on the second light emitting layer, and a second cathode on the second electron control layer,
the third organic light emitting diode includes a third anode in the third light emitting region, a third hole control layer on the third anode, a third resonance control layer on the third hole control layer, a third light emitting layer on the third resonance control layer and overlapping the first to third light emitting regions and the non-light emitting region, a third electron control layer on the third light emitting layer, and a third cathode on the third electron control layer,
the first to third control layers are portions of a common hole control layer that is a single body,
the first to third electron control layers are portions of a common electron control layer that is a single body, and
the first to third cathodes are portions of a common cathode that is a single body.

23. The organic light emitting display device as claimed in claim 22, wherein the common hole control layer includes a hole transport layer that transports holes to the first to third light emitting layers.

24. The organic light emitting display device as claimed in claim 23, wherein:
the hole transport layer includes a doped layer and an undoped layer that are divided in a thickness direction of the hole transport layer, the undoped layer being closer to the first to third light emitting layers than is the doped layer,
the doped layer includes a p-type dopant and a hole transport material, and
the undoped layer includes a hole transport material.

25. The organic light emitting display device as claimed in claim 23, wherein the common hole control layer further includes a hole injection layer that injects holes from the first to third anodes to the hole transport layer.

26. The organic light emitting display device as claimed in claim 22, further comprising an intermediate layer that is between the common hole control layer and the first to third anodes and that generates holes.

27. The organic light emitting display device as claimed in claim 26, wherein the intermediate layer includes hexaazatriphenylene hexacarbonitrile, molybdenum trioxide, or fullerene.

28. The organic light emitting display device as claimed in claim 22, wherein the third light emitting layer includes an ambipolar compound.

29. The organic light emitting display device as claimed in claim 28, wherein the ambipolar compound includes anthracene, 9-phenylanthracene, 9,10-diphenylanthracene, or benzo(B)naphto(2,3-D)furan.

30. The organic light emitting display device as claimed in claim 22, wherein the third light emitting layer includes:
   a first portion between the common hole control layer and the first light emitting layer,
   a second portion between the common hole control layer and the second light emitting layer, and
   a third portion between the third light emitting layer and the common electron layer.

31. The organic light emitting display device as claimed in claim 30, wherein the first resonance control layer has a LUMO level that is at least 0.2 eV higher than that of the first light emitting layer.

32. The organic light emitting display device as claimed in claim 22, wherein the third light emitting layer includes:
   a first portion between the common electron control layer and the first light emitting layer,
   a second portion between the common electron control layer and the second light emitting layer, and
   a third portion between the third light emitting layer and the common electron control layer.

33. The organic light emitting display device as claimed in claim 20, wherein:
   light of the first wavelength is a red light,
   light of the second wavelength is a green light, and
   light of the third wavelength is a blue light.

* * * * *